(12) United States Patent
Lu et al.

(10) Patent No.: US 12,100,468 B2
(45) Date of Patent: Sep. 24, 2024

(54) STANDALONE MODE

(71) Applicant: Micron Technology, Inc., Boise, ID (US)

(72) Inventors: Yang Lu, Boise, ID (US); Mark Kalei Hadrick, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 17/930,034

(22) Filed: Sep. 6, 2022

(65) Prior Publication Data

US 2024/0079036 A1  Mar. 7, 2024

(51) Int. Cl.
*G11C 7/10* (2006.01)
*G06F 13/16* (2006.01)

(52) U.S. Cl.
CPC ........ *G11C 7/1045* (2013.01); *G06F 13/1668* (2013.01)

(58) Field of Classification Search
CPC ...... G06F 13/16; G06F 13/1668; G06F 12/02; G11C 7/1045
See application file for complete search history.

(56) References Cited

U.S. PATENT DOCUMENTS

| | | | | |
|---|---|---|---|---|
| 9,196,316 B2 * | 11/2015 | Chu | ................... | G11C 7/20 |
| 11,966,621 B2 * | 4/2024 | Hsu | ................... | G06F 3/0655 |
| 2008/0061319 A1 * | 3/2008 | Madhani | ............... | H01L 24/05 |
| | | | | 257/E23.146 |
| 2008/0165589 A1 * | 7/2008 | Hung | ................... | G11C 7/1072 |
| | | | | 365/194 |
| 2015/0155039 A1 * | 6/2015 | Tran | ................... | G11C 7/1045 |
| | | | | 365/185.18 |
| 2021/0311887 A1 * | 10/2021 | Hieb | ................... | G06F 13/1668 |
| 2021/0334226 A1 * | 10/2021 | Yeung | ................. | G06F 13/382 |

(Continued)

FOREIGN PATENT DOCUMENTS

| | | | | |
|---|---|---|---|---|
| EP | 0570729 A2 * | 11/1993 | ............. | G06F 15/16 |
| EP | 1251521 A1 * | 10/2002 | ........... | G11C 11/406 |
| EP | 1531640 A2 * | 5/2005 | ............ | H04B 1/401 |

OTHER PUBLICATIONS

Ashok K. Sharma, "Advanced Nonvolatile Memory Designs and Technologies," in Advanced Semiconductor Memories: Architectures, Designs, and Applications, IEEE, 2003, pp. 319-477.*

*Primary Examiner* — Pierre Michel Bataille
(74) *Attorney, Agent, or Firm* — Colby Nipper PLLC

(57) ABSTRACT

Apparatuses and techniques for implementing a standalone mode are described. The standalone mode refers to a mode in which a die that is designed to operate as one of multiple dies that are interconnected can operate independently of another one of the multiple dies. Prior to connecting the die to the other die, the die can perform a standalone read operation and/or a standalone write operation in accordance with the standalone mode. In this way, testing (or debugging) can be performed during an earlier stage in the manufacturing process before integrating the die into an interconnected die architecture. For example, this type of testing can be performed at a wafer level or at a single-die-package (SDP) level. In general, the standalone mode can be executed independent of whether the die is connected to the other die.

35 Claims, 18 Drawing Sheets

(56) References Cited

U.S. PATENT DOCUMENTS

| | | | |
|---|---|---|---|
| 2021/0407572 A1* | 12/2021 | Song | H01L 25/16 |
| 2022/0102889 A1* | 3/2022 | Boyd | H01R 12/88 |
| 2023/0259300 A1* | 8/2023 | Hsu | G11C 16/10 |
| | | | 711/154 |

* cited by examiner

1400 ⟶

Perform a standalone write operation or a standalone read operation prior to a connected data pin of a die being coupled to another connected data pin of another die
1402

Couple the connected data pin of the die to another connected data pin of the other die
1404

Perform a write operation or a read operation jointly with the other die based on the connected data pin being coupled to the other connected data pin of the other die
1406

FIG. 14

STANDALONE MODE

BACKGROUND

A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek smaller memories as the form factors of portable electronic device continue to shrink. Accommodating these various demands is thus complicated by the diverse strengths and capabilities of different types of memories.

BRIEF DESCRIPTION OF THE DRAWINGS

Apparatuses of and techniques for implementing a standalone mode are described with reference to the following drawings. The same numbers are used throughout the drawings to reference like features and components:

FIG. 8-1 illustrates an example interface die performing aspects of a write operation in accordance with an interconnected mode;

FIG. 8-2 illustrates an example linked die performing aspects of a write operation in accordance with an interconnected mode;

FIG. 9-1 illustrates an example interface die performing aspects of a read operation in accordance with an interconnected mode;

FIG. 9-2 illustrates an example linked die performing aspects of a read operation in accordance with an interconnected mode;

FIG. 14 illustrates an example method for implementing a standalone mode;

DETAILED DESCRIPTION

Overview

Figure 1:
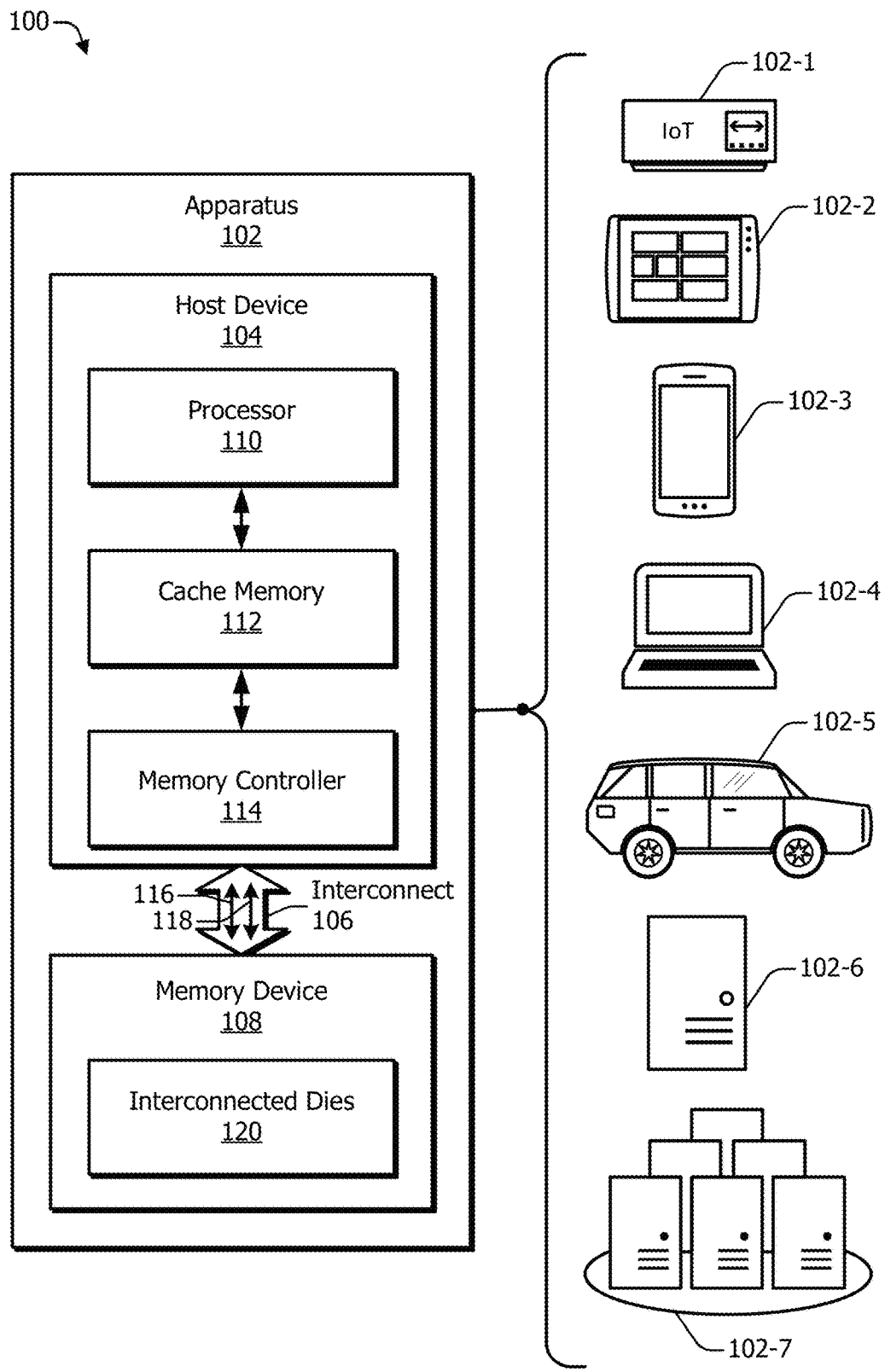
FIG. 1 illustrates an example operating environment including apparatuses that can implement aspects of a standalone mode.

Computers, smartphones, and other electronic devices operate using processors and memories to run a variety of programs and applications, ranging from low-power operating systems and background utilities to computationally intensive applications for high-resolution graphics, computer simulations, artificial intelligence (AI), and so forth. Execution speeds associated with these programs and applications are often related to the performance of a memory of the electronic device, which is contingent, in part, on any delays associated with memory transfer.

A memory device may have an interconnected die architecture (e.g., a stacked or linked die architecture). This architecture uses at least one set of interconnected dies (or at least one set of interconnected dice), such as at least one interface die that is connected to at least one linked die within a combined package. The interface die can directly send data to or receive data from a memory controller. In contrast, the linked die indirectly sends data to or receives data from the memory controller through the interface die. Explained another way, the interface die acts as an interface and passes data between the linked die and the memory controller. The interface and linked dies may share joint access to an address bus. The interconnected die architecture can be relatively lower cost and/or occupy a smaller volume compared to other architectures with multiple dies.

The interface and linked dies are designed to operate together. Although the interface and linked dies can undergo testing and debugging once connected together, identifying problems at this stage can be costly. It would be beneficial to be able to test and debug the interface and linked dies individually at earlier stages in the manufacturing process (e.g., prior to integration within the interconnected die architecture).

To address this and other issues regarding an interconnected die architecture, this document describes aspects of a standalone mode. The standalone mode refers to a mode in which a die that is designed to operate as one of multiple dies that are interconnected can operate independently of another one of the multiple dies. Prior to connecting the die to the other die, the die can perform a standalone read operation and/or a standalone write operation in accordance with the standalone mode. In this way, testing (or debugging) can be performed during an earlier stage in the manufacturing process before integrating the die into an interconnected die architecture. For example, this type of testing can be performed at a wafer level or at a single-die-package (SDP) level. In general, the standalone mode can be executed independent of whether the die is connected to the other die.

In some cases, the apparatuses and methods that are described herein may be appropriate for memory that is designed for lower power operations or that is targeted for energy-efficient applications. Thus, the described principles may be incorporated into a low-power memory device or a memory controller that communicates with such a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

The density of memory devices continues to increase to maximize available memory and circuit area because improved communication protocols allow for higher rates of data transfer between processors and memory devices. An example of such an improved protocol is the Compute Express Link™ (CXL™) protocol or standard (referred to hereinafter as "the CXL protocol" or "the CXL standard"). The CXL protocol can be implemented over a physical layer that is governed by, for instance, the PCIe® (Peripheral Component Interconnect Express) protocol. The CXL protocol targets intensive workloads for processors and memory devices (e.g., accelerators, memory expanders), where efficient, coherent memory access or interactions between processors and memory is advantageous.

The CXL protocol addresses some of the limitations of PCIe links by providing an interface that leverages, for example, the PCIe 5.0 physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expanders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing.

A standalone mode may be used in CXL implementations. An example implementation, for instance, can include a memory device with multiple memory controllers and/or one or more sets of interconnected dies. Each set of interconnected dies includes at least one interface die that is connected to at least one linked die via an interconnect. The interface die can directly send data to or receive data from a memory controller. In contrast, the linked die indirectly sends data to or receives data from the memory controller through the interface die and the interconnect. Explained another way, the interface die acts as an interface and transfers data between the linked die and the memory controller.

In aspects, a standalone mode may be used to test the interface die or the linked die in situations where high-density memory is used, for example in CXL implementations. However, the standalone mode may be implemented in various other types of memory devices with interconnected dies to facilitate testing prior to integration.

Example Operating Environments

FIG. 1 illustrates, at 100 generally, an example operating environment including an apparatus 102 that can implement a standalone mode. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a PCB). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a DDR memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

In some implementations, the interconnect 106 can include at least one command and address bus 116 (CA bus 116) and at least one data bus 118 (DQ bus 118). Each bus may be a unidirectional or a bidirectional bus. The CA bus 116 and the DQ bus 118 may couple to CA and DQ pins, respectively, of the memory device 108. The interconnect 106 may also include a chip-select (CS) I/O or line (not illustrated in FIG. 1) that can, for example, couple to one or more CS pins of the memory device 108. The interconnect 106 may further include a clock bus (CK bus—not illustrated in FIG. 1) that is part of or separate from the CA bus 122.

In other implementations, the interconnect 106 can be realized as a CXL link. In other words, the interconnect 106 can comport with at least one CXL standard or protocol. The CXL link can provide an interface on top of the physical layer and electricals of a PCIe 5.0 physical layer. The CXL link can cause requests to and responses from the memory device 108 to be packaged as flits. An example implementation of the apparatus 102 with a CXL link is discussed in greater detail with respect to FIG. 4. In still other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated together on an IC or fabricated on separate ICs and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 2 an example computing system architecture having at least one host device 104 coupled to a memory device 108.

Two or more memory components (e.g., modules, dies, banks, or bank groups) can share the electrical paths or couplings of the interconnect 106. In some implementations, the CA bus 116 transmits addresses and commands from the memory controller 114 of the host device 104 to the memory device 108, which may exclude propagation of data. The DQ bus 118 can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, and as discussed in greater detail with respect to FIG. 3, at least a portion of the memory device 108 has an interconnected die architecture (e.g., a stacked die architecture or linked die architecture) with at least two interconnected dies 120. The interconnected die architecture enables the memory device 108 to use two or more interconnected dies 120 for a single write or read access along a shared data path, which can be controlled or managed by a die of the interconnected dies 120.

The interconnected dies 120 operate jointly to handle write and read requests issued by the memory controller 114 or another memory controller within the memory device 108, depending on implementation. Each interconnected die 120 can also handle standalone write and/or read requests issued through a mode register or a test mode. The interconnected dies 120 are further described with respect to FIGS. 5 and 6. The memory device 108 is further described with respect to FIG. 2.

Figure 2:
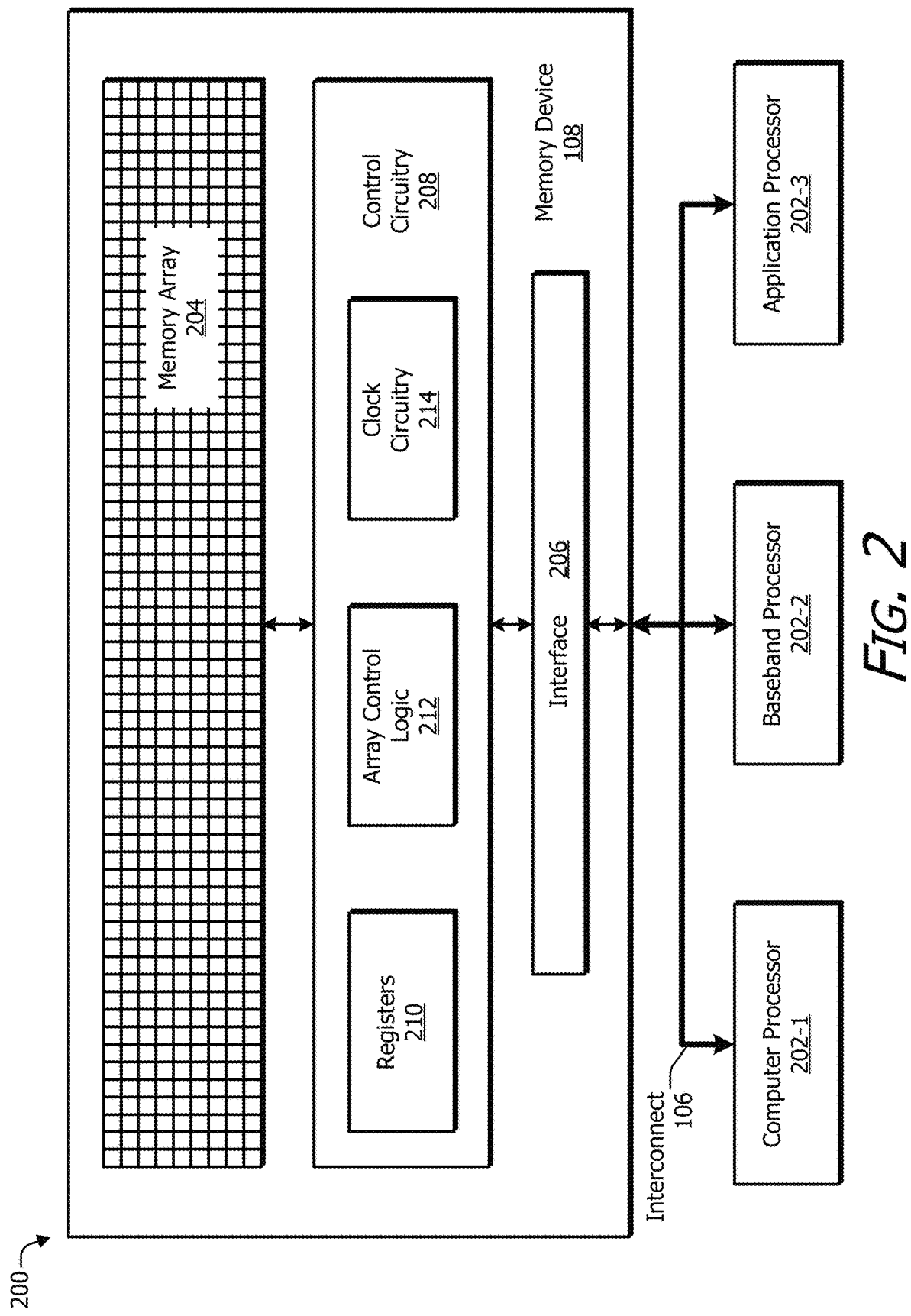
FIG. 2 illustrates an example computing system that can implement aspects of a standalone mode.

FIG. 2 illustrates an example computing system 200 that can implement aspects of a standalone mode. In some implementations, the computing system 200 includes at least one memory device 108, at least one interconnect 106, and at least one processor 202.

The memory device 108 can include, or be associated with, at least one memory array 204, at least one interface 206, and control circuitry 208 operatively coupled to the memory array 204. The memory device 108 can correspond to one or more of the cache memory, the main memory, or a storage memory of the apparatus 102 of FIG. 1. Thus, the memory array 204 can include an array of memory cells, including but not limited to memory cells of DRAM, SDRAM, 3D-stacked DRAM, DDR memory, low-power DRAM, or LPDDR SDRAM. For example, the memory array 204 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb.

The memory array 204 and the control circuitry 208 may be components on a single semiconductor die or on separate semiconductor dies. The memory array 204 or the control circuitry 208 may also be distributed across multiple dies, such as the interconnected dies 120. Although not explicitly shown in FIG. 2, the control circuitry 208 may include circuitry enabling one interconnected die to communicate with another interconnected die. This control circuitry may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include one or more registers 210, at least one instance of array control logic 212, and clock circuitry 214. The registers 210 may be implemented, for example, as one or more registers that can store information to be used by the control circuitry 208 or another part of the memory device 108. At least one of the registers 210 can include a mode register. The array control logic 212 can include circuitry that provides command decoding, address decoding, input/output functions, amplification circuitry, power supply management, power control modes, and other functions. The clock circuitry 214 can synchronize various memory components with one or more external clock signals provided over the interconnect 106, including a command/address clock or a data clock. The clock circuitry 214 can also use an internal clock signal to synchronize memory components and may provide timer functionality.

The interface 206 can couple the control circuitry 208 or the memory array 204 directly or indirectly to the interconnect 106. As shown in FIG. 2, the registers 210, the array control logic 212, and the clock circuitry 214 can be part of a single component (e.g., the control circuitry 208). In other implementations, one or more of the registers 210, the array control logic 212, or the clock circuitry 214 may be separate components on a single semiconductor die or distributed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 116 and a DQ bus 118 (as illustrated in FIG. 1). As discussed above with respect to FIG. 1, the interconnect 106 can include a CXL link or comport with at least one CXL standard. The CXL link can provide an interface or overlay on top of the physical layer and electricals of the PCIe 5.0 physical layer.

In some aspects, the memory device 108 may be a "separate" component relative to the host device 104 (of FIG. 1) or any of the processors 202. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a PCB or in a single package or an SoC.

As shown in FIG. 2, the processors 202 may include a computer processor 202-1, a baseband processor 202-2, and an application processor 202-3, coupled to the memory device 108 through the interconnect 106. The processors 202 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, WiFi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized as one that can communicate over a CXL-compatible interconnect. Accordingly, a respective processor 202 can include or be associated with a respective link controller, like the link controller 402 illustrated in FIG. 4. Alternatively, two or more processors 202 may access the memory device 108 using a shared link controller 402. In some of such cases, the memory device 108 may be implemented as a CXL-compatible memory device (e.g., as a CXL Type 3 memory expander) or another memory device that is compatible with a CXL protocol may also or instead be coupled to the interconnect 106.

Example Techniques and Hardware

Figure 3:
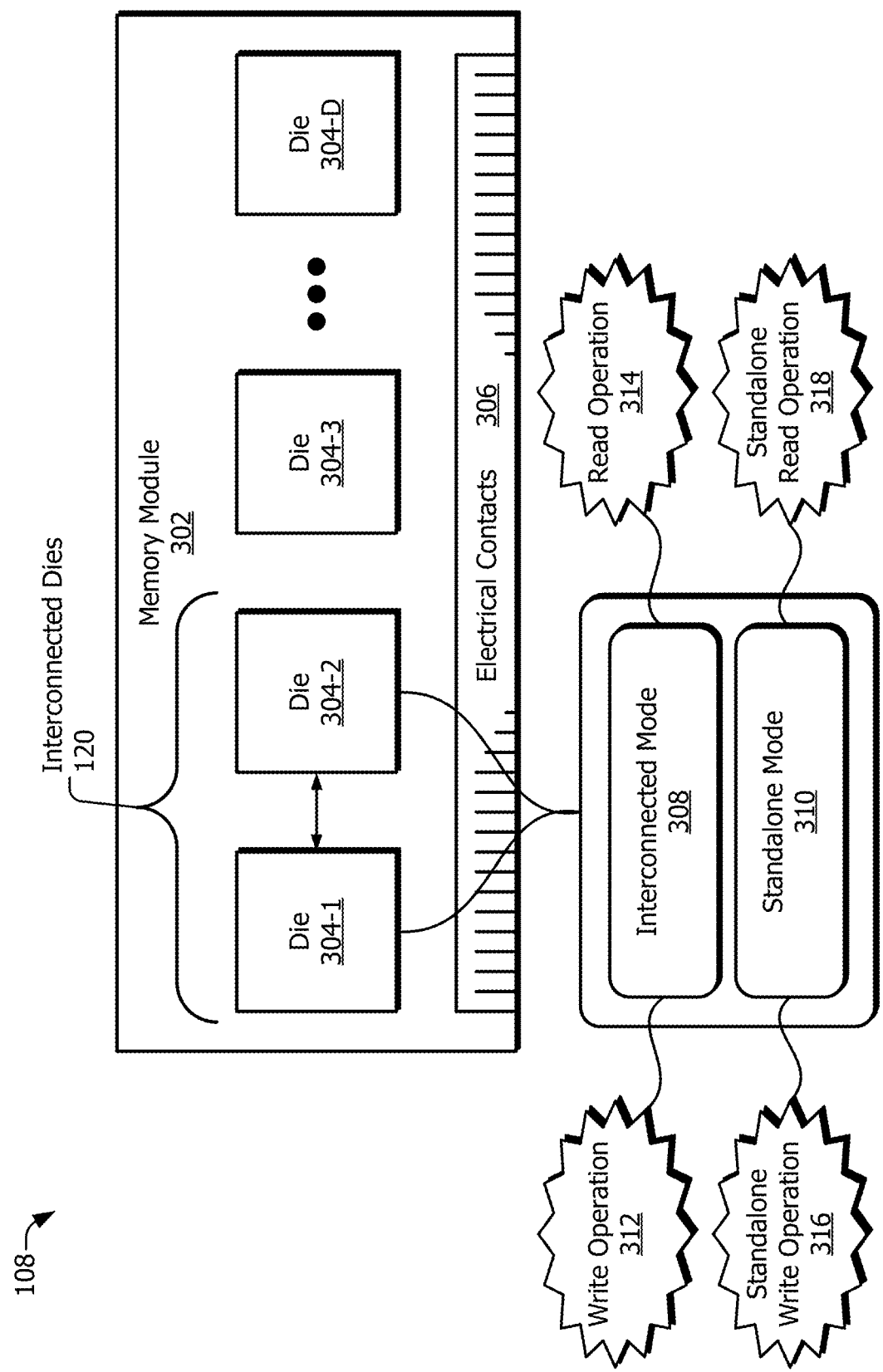
FIG. 3 illustrates an example memory device in which a standalone mode can be implemented.

FIG. 3 illustrates an example memory device 108 in which a standalone mode can be implemented. An example memory module 302 includes multiple dies 304. As illustrated, the memory module 302 includes a first die 304-1, a second die 304-2, a third die 304-3, and a Dth die 304-D, with D representing a positive integer. Two or more of the dies 304-1 to 304-D can be implemented as interconnected dies 120. For example, the dies 304-1 and 304-2 can be interconnected dies 120. In some cases, the memory module 302 includes multiple sets of interconnected dies 120, such as multiple pairs of interconnected dies, or includes a set of interconnected dies 120 that has four or more dies.

As a few examples, the memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or a memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. In some cases, the memory module 302 may be part of a CXL memory system or module.

Each die 304 within the interconnected dies 120 can selectively operate according to an interconnected mode 308 (e.g., a normal operational mode or a mission mode) and a standalone mode 310 (e.g., an isolated test mode). During the interconnected mode 308, the die 304 can jointly operate with the other die to perform a write operation 312 and/or a read operation 314. During the write operation 312, the two dies 304 write different chunks (or portions) of a burst of write data, as further described with respect to FIGS. 8-1 and 8-2. During the read operation 314, the two dies 304 read different chunks (or portions) of a burst of read data, as further described with respect to FIGS. 9-1 and 9-2. For the interconnected mode 308, the die 304 is configured as an interface die or a linked die, which are further described with respect to FIG. 5. In general, the die 304 can execute the interconnected mode 308 once the die 304 is integrated within the interconnected die architecture (e.g., while the die 304 is connected to another die of the interconnected dies 120).

During the standalone mode 310, the die 304 can operate independent of another die within the interconnected dies 120 to perform a standalone write operation 316 and/or a standalone read operation 318 (e.g., a mode register read (MRR) operation). For the standalone mode 310, the die 304 is configured as an interface die regardless of whether the die 304 is meant to operate as a linked die or an interface die within the linked die architecture (e.g., for the interconnected mode 308). The standalone write operation 316 is similar to the write operation 312 with the exception that data meant for the linked die is discarded or ignored. For example, during the standalone write operation 316, the die 304 writes a first chunk of a burst of write data to its memory array 204 and discards a second chunk of the burst of write data. The standalone write operation 316 is further described with respect to FIG. 10.

The standalone read operation 318 is similar to the read operation 314 with the exception that the die 304 generates alternative data to represent the data that would have otherwise been provided by the linked die. For example, during the standalone read operation 318, the die 304 reads a first chunk of a burst of read data and generates a second chunk of the burst of read data. The standalone read operation 318 is further described with respect to FIG. 11. The standalone mode 310 supports testing of the die 304 prior to integration within the interconnected dies 120. In general, however, the die 304 can execute the standalone mode 310 regardless of whether the die 304 is connected to another die of the interconnected dies 120.

Figure 4:
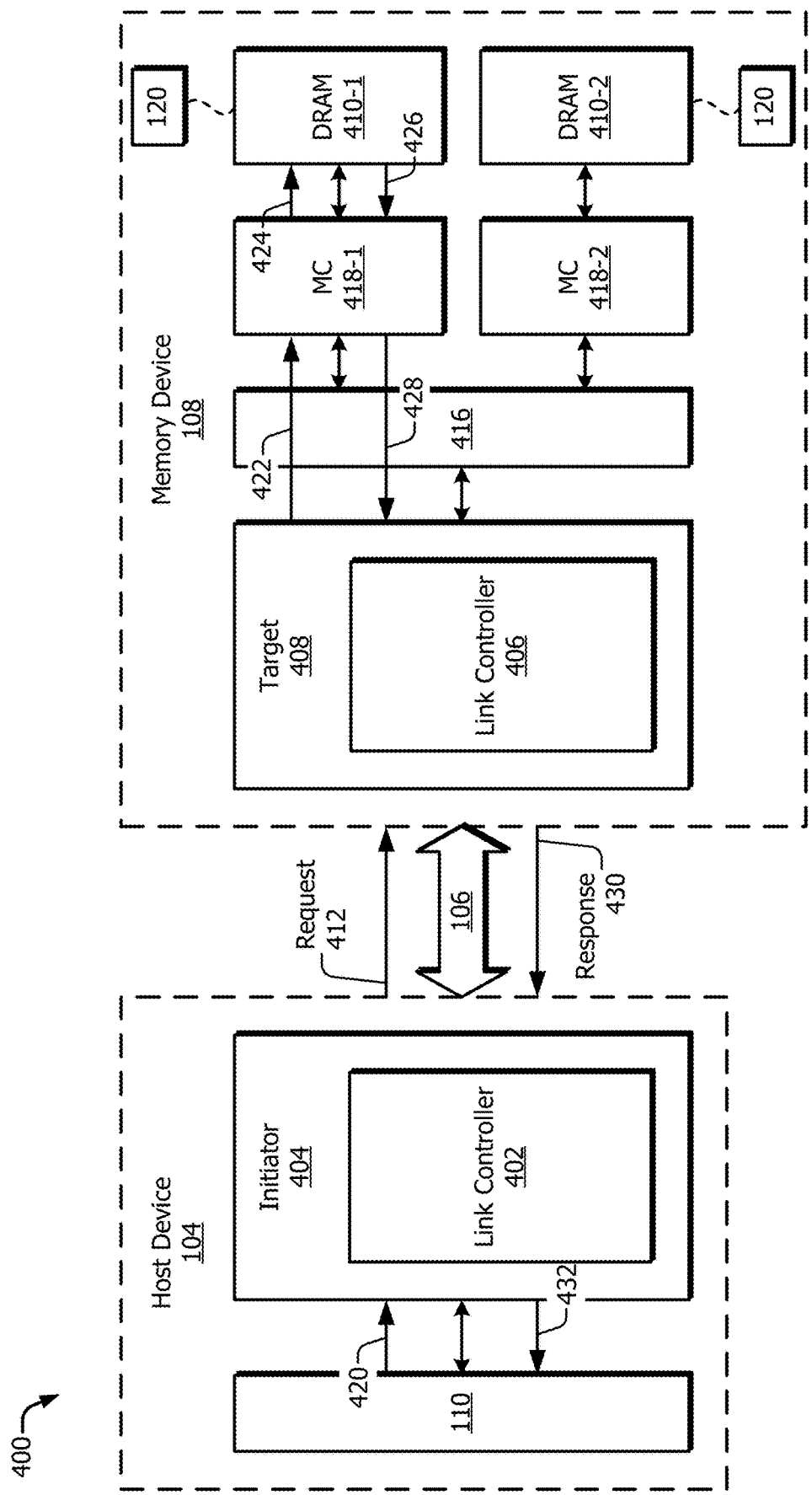
FIG. 4 illustrates an example of a system that includes a host device and a memory device coupled together via an interconnect in which a standalone mode may be implemented within the memory device.

FIG. 4 illustrates an example of a system 400 that includes a host device 104 and a memory device 108 that are coupled together via an interconnect 106. The system 400 may form at least part of an apparatus 102 as shown in FIG. 1. As illustrated, the host device 104 includes a processor 110 and a link controller 402, which can be realized with at least one initiator 404. Thus, the initiator 404 can be coupled to the processor 110 or to the interconnect 106 (including to both), and the initiator 404 can be coupled between the processor 110 and the interconnect 106. Examples of initiators 404 may include a leader, a primary, a master, a main component, and so forth.

In the illustrated example system 400, the memory device 108 includes a link controller 406, which may be realized with at least one target 408. The target 408 can be coupled to the interconnect 106. Thus, the target 408 and the initiator 404 can be coupled to each other via the interconnect 106. Example targets 408 may include a follower, a secondary, a slave, a responding component, and so forth. The memory device 108 also includes a memory, which may be realized with at least one memory module 302 or other component, such as a DRAM 410, as is described further below.

In example implementations, the initiator 404 includes the link controller 402, and the target 408 includes the link controller 406. The link controller 402 or the link controller 406 can instigate, coordinate, cause, or otherwise control signaling across a physical or logical link realized by the interconnect 106 in accordance with one or more protocols. The link controller 402 may be coupled to the interconnect 106. The link controller 406 may also be coupled to the interconnect 106. Thus, the link controller 402 can be coupled to the link controller 406 via the interconnect 106. Each link controller 402 or 406 may, for instance, control communications over the interconnect 106 at a link layer or at one or more other layers of a given protocol. Communication signaling may include, for example, a request 412 (e.g., a write request or a read request), a response 414 (e.g., a write response or a read response), and so forth.

The memory device 108 may further include at least one interconnect 416 and at least one memory controller 418 (e.g., MC 418-1 and MC 418-2). Within the memory device 108, and relative to the target 408, the interconnect 416, the memory controller 418, and/or the DRAM 410 (or other memory component) may be referred to as a "backend" component of the memory device 108. In some cases, the interconnect 416 is internal to the memory device 108 and may operate in a manner the same as or different from the interconnect 106.

As shown, the memory device 108 may include multiple memory controllers 418-1 and 418-2 and/or multiple DRAMs 410-1 and 410-2. Although two each are shown, the memory device 108 may include one or more memory controllers 418 and/or one or more DRAMs 410. For example, a memory device 108 may include four memory controllers 418 and sixteen DRAMs 410, such as four DRAMs 410 per memory controller 418. The memory components of the memory device 108 are depicted as DRAM 410 only as an example, for one or more of the memory components may be implemented as another type of memory. For instance, the memory components may include nonvolatile memory like flash or PCM. Alternatively, the memory components may include other types of volatile memory like static random-access memory (SRAM). A memory device 108 may also include any combination of memory types. In example implementations, the DRAM 410-1 and/or the DRAM 410-2 include interconnected dies 120.

In some cases, the memory device 108 may include the target 408, the interconnect 416, the at least one memory controller 418, and the at least one DRAM 410 within a single housing or other enclosure. The enclosure, however, may be omitted or may be merged with an enclosure for the host device 104, the system 400, or an apparatus 102 (of FIG. 1). The interconnect 416 can be disposed on a PCB. Each of the target 408, the memory controller 418, and the DRAM 410 may be fabricated on at least one IC and packaged together or separately. The packaged ICs may be secured to or otherwise supported by the PCB and may be directly or indirectly coupled to the interconnect 416. In other cases, the target 408, the interconnect 416, and the one or more memory controllers 418 may be integrated together into one IC. In some of such cases, this IC may be coupled to a PCB, and one or more modules for the memory components (e.g., for the DRAM 410) may also be coupled to the same PCB, which can form a CXL type of memory device 108. This memory device 108 may be enclosed within a housing or may include such a housing. The components of the memory device 108 may, however, be fabricated, packaged, combined, and/or housed in other manners.

As illustrated in FIG. 4, the target 408, including the link controller 406 thereof, can be coupled to the interconnect 416. Each memory controller 418 of the multiple memory controllers 418-1 and 418-2 can also be coupled to the interconnect 416. Accordingly, the target 408 and each memory controller 418 of the multiple memory controllers 418-1 and 418-2 can communicate with each other via the interconnect 416. Each memory controller 418 is coupled to at least one DRAM 410. As shown, each respective memory controller 418 of the multiple memory controllers 418-1 and 418-2 is coupled to at least one respective DRAM 410 of the multiple DRAMs 410-1 and 410-2. Each memory controller 418 of the multiple memory controllers 418-1 and 418-2 may, however, be coupled to a respective set of multiple DRAMs 410 (e.g., five DRAMs 410) or other memory components.

Each memory controller 418 can access at least one DRAM 410 by implementing one or more memory access protocols to facilitate reading or writing data based on at least one memory address. The memory controller 418 can increase bandwidth or reduce latency for the memory accessing based on the memory type or organization of the memory components, like the DRAMs 410. The multiple memory controllers 418-1 and 418-2 and the multiple DRAMs 410-1 and 410-2 can be organized in many different manners. For example, each memory controller 418 can realize one or more memory channels for accessing the DRAMs 410. Further, the DRAMs 410 can be manufactured to include one or more ranks, such as a single-rank or a dual-rank memory module. Each DRAM 410 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 420 to the initiator 404. The memory access request 420 may be propagated over a bus or other interconnect that is internal to the host device 104. This memory access request 420 may be or may include a read request or a write request. The initiator 404, such as the link controller 402 thereof, can reformulate the memory access request 420 into a format that is suitable for the interconnect 106. This formulation may be performed based on a physical protocol or a logical protocol (including both) applicable to the interconnect 106. Examples of such protocols are described below.

The initiator 404 can thus prepare a request 412 and transmit the request 412 over the interconnect 106 to the target 408. The target 408 receives the request 412 from the initiator 404 via the interconnect 106. The target 408, including the link controller 406 thereof, can process the request 412 to determine (e.g., extract or decode) the memory access request 420. Based on the determined memory access request 420, the target 408 can forward a memory request 422 over the interconnect 416 to a memory controller 418, which is the first memory controller 418-1 in this example. For other memory accesses, the targeted data may be accessed with the second DRAM 410-2 through the second memory controller 418-2.

The first memory controller 418-1 can prepare a memory command 424 based on the memory request 422. The first memory controller 418-1 can provide the memory command 424 to the first DRAM 410-1 over an interface or interconnect appropriate for the type of DRAM or other memory component. The first DRAM 410-1 receives the memory command 424 from the first memory controller 418-1 and can perform the corresponding memory operation. The memory command 424, and corresponding memory operation, may pertain to a read operation, a write operation, a refresh operation, and so forth. Based on the results of the memory operation, the first DRAM 410-1 can generate a memory response 426. If the memory request 422 is for a read operation, the memory response 426 can include the requested data. If the memory request 422 is for a write operation, the memory response 426 can include an acknowledgment that the write operation was performed successfully. The first DRAM 410-1 can return the memory response 426 to the first memory controller 418-1.

The first memory controller 418-1 receives the memory response 426 from the first DRAM 410-1. Based on the memory response 426, the first memory controller 418-1 can prepare a memory response 428 and transmit the memory response 428 to the target 408 via the interconnect 416. The target 408 receives the memory response 428 from the first memory controller 418-1 via the interconnect 416. Based on this memory response 428, and responsive to the corresponding request 412, the target 408 can formulate a response 430 for the requested memory operation. The response 430 can include read data or a write acknowledgment and be formulated in accordance with one or more protocols of the interconnect 106.

To respond to the request 412 from the host device 104, the target 408 can transmit the response 430 to the initiator 404 over the interconnect 106. Thus, the initiator 404 receives the response 430 from the target 408 via the interconnect 106. The initiator 404 can therefore respond to the "originating" memory access request 420, which is from the processor 110 in this example. To do so, the initiator 404 prepares a memory access response 432 using the information from the response 430 and provides the memory access response 432 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 404 and the target 408. Generally, the interconnect 106 can carry memory-related information, such as data or a memory address, between the initiator 404 and the target 408. In some cases, the initiator 404 or the target 408 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 404, to transmit another memory request 412 to the target 408. The target 408 may return credits to "refill" a credit balance at the initiator 404. A credit-based communication scheme across the interconnect 106 may be implemented by credit logic of the target 408 or by credit logic of the initiator 404 (including by both working together in tandem).

The system 400, the initiator 404 of the host device 104, or the target 408 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 404 or the target 408 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 402 and the link controller 406 can be CXL controllers.

Examples of the standalone mode 310 are described herein with reference to at least one memory controller 114 or 418 and at least one memory device 108 (e.g., having a memory array 204, a memory module 302, and/or a DRAM 410), including interconnected dies 120 thereof. The interconnected dies 120 are further described with respect to FIGS. 5 and 6.

Figure 5:
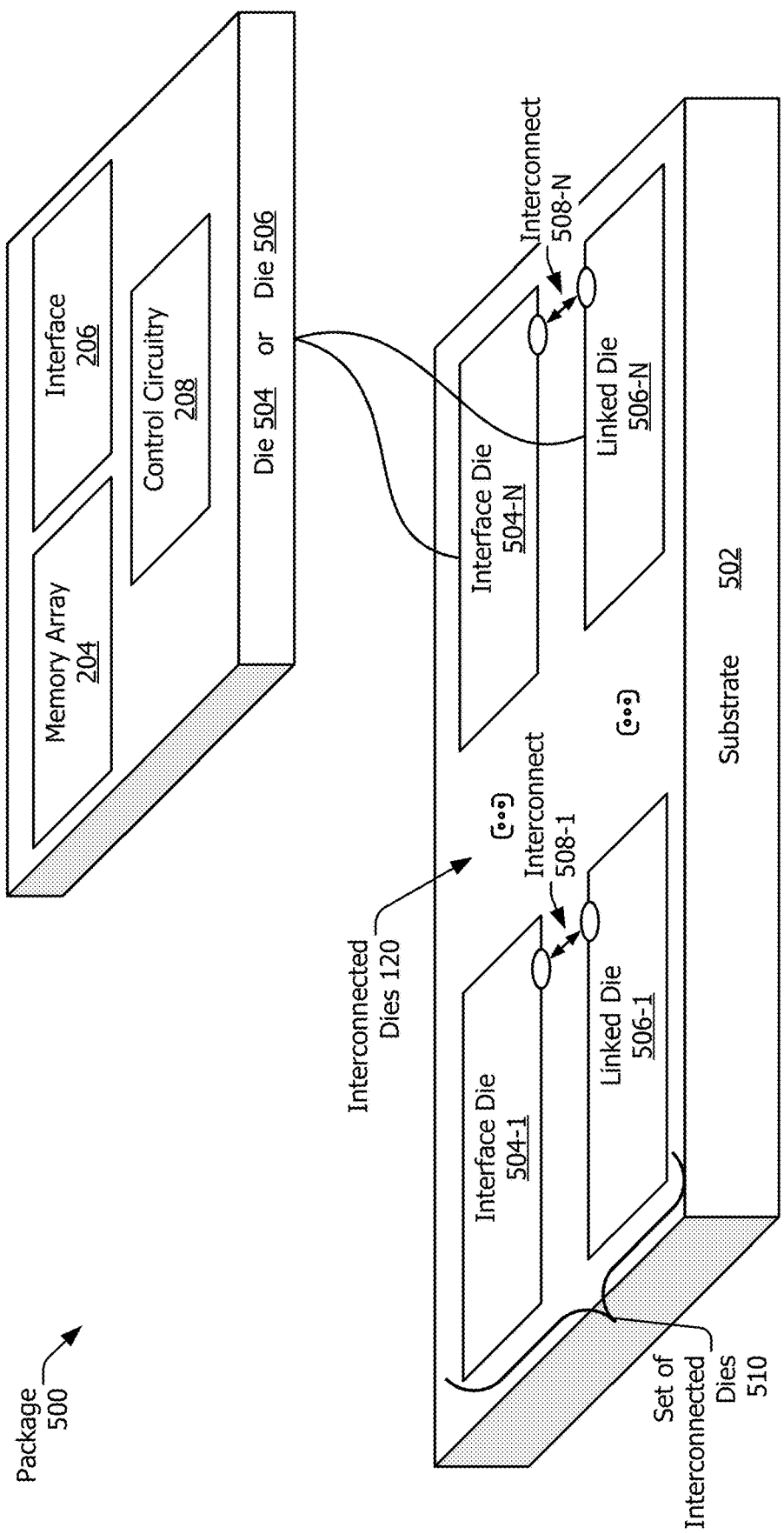
FIG. 5 illustrates an example package with interconnected dies capable of operating in accordance with a standalone mode.

FIG. 5 illustrates an example package 500 with interconnected dies 120 that can individually operate according to the standalone mode 310. Although not shown, the package 500 can also include other components, such as one or more other components of the memory device 108 and/or one or more components of the host device 104. In the depicted configuration, the package 500 includes a substrate 502. The interconnected dies 120 are disposed on or embedded in the substrate 502. The interconnected dies 120 include at least one interface die 504 and at least one linked die 506. In this example, the package 500 is shown to include interface dies 504-1 to 504-N and linked dies 506-1 to 506-N, where N represents a positive integer. Each linked die 506 is coupled to an interface die 504 via an interconnect 508. In FIG. 5, the linked dies 506-1 to 506-N are respectively coupled to the interface dies 504-1 to 504-N by the interconnects 508-1 to 508-N.

Although not explicitly shown, the interface die 504 is operatively coupled to the memory controller 114 or 418 (e.g., of FIG. 1 or 4) and acts as an interface between the linked die 506 and the memory controller 114 or 418 for at least data transfers or exchanges. Although the interface die 504 and the linked die 506 can behave differently, the interface die 504 and the linked die 506 can optionally be manufactured as a same type of die that includes the same circuit components. Once the package 500 is assembled, each of the dies can be programmed to function as an interface die 504 or a linked die 506. As an example, the interconnected dies 120 can be programmed by setting at least one respective fuse in each die 304.

In example aspects, a set of interconnected dies 510 can refer to one interface die 504 and one linked die 506. However, other configurations are also possible in which an interface die 504 is operatively coupled to two or more linked dies 506. In general, the set of interconnected dies 510 refers to a group of interconnected dies 120 that are operatively coupled together. For example, the linked die 506 within the set of interconnected dies 510 is operatively coupled, via the interconnect 508, to the interface die 504 within the set of interconnected dies 510. Also, the interface die 504 within the set of interconnected dies 510 is operatively coupled, via the interconnect 508, to one or more linked dies 506 within the set of interconnected dies 510. In FIG. 5, the interface die 504-1 and the linked die 506-1 can represent a first set of interconnected dies 510, and the interface die 504-N and the linked die 506-N can represent an Nth set of interconnected dies 510.

The interconnects 508-1 to 508-N can transfer data between corresponding interface dies 504-1 to 504-N and linked dies 506-1 to 506-N, respectively. For example, the interconnect 508-1 can transfer data between the interface die 504-1 and the linked die 506-1. Likewise, the interconnect 508-N can transfer data between the interface die 504-N and the linked die 506-N. In an example implementation, the interconnects 508 support the transfer of 128 bits (e.g., 16 bytes) per access. Although the interconnects 508-1 to 508-N are illustrated with individual lines in FIG. 5, each interconnect 508 can include at least one bus, at least one switching fabric, one or more wires or traces that carry voltage or current signals, at least one switch, one or more buffers, and so forth.

The interface die 504 and/or the linked die 506 can each include at least one memory array 204, at least one interface 206, and control circuitry 208. The interface 206 can couple the control circuitry 208 or the memory array 204 directly or indirectly to the interconnect 508. The interface 206 can also include a data bus. Example pins of the interface die 504 and the linked die 506 are further described with respect to FIG. 6.

Figure 6:
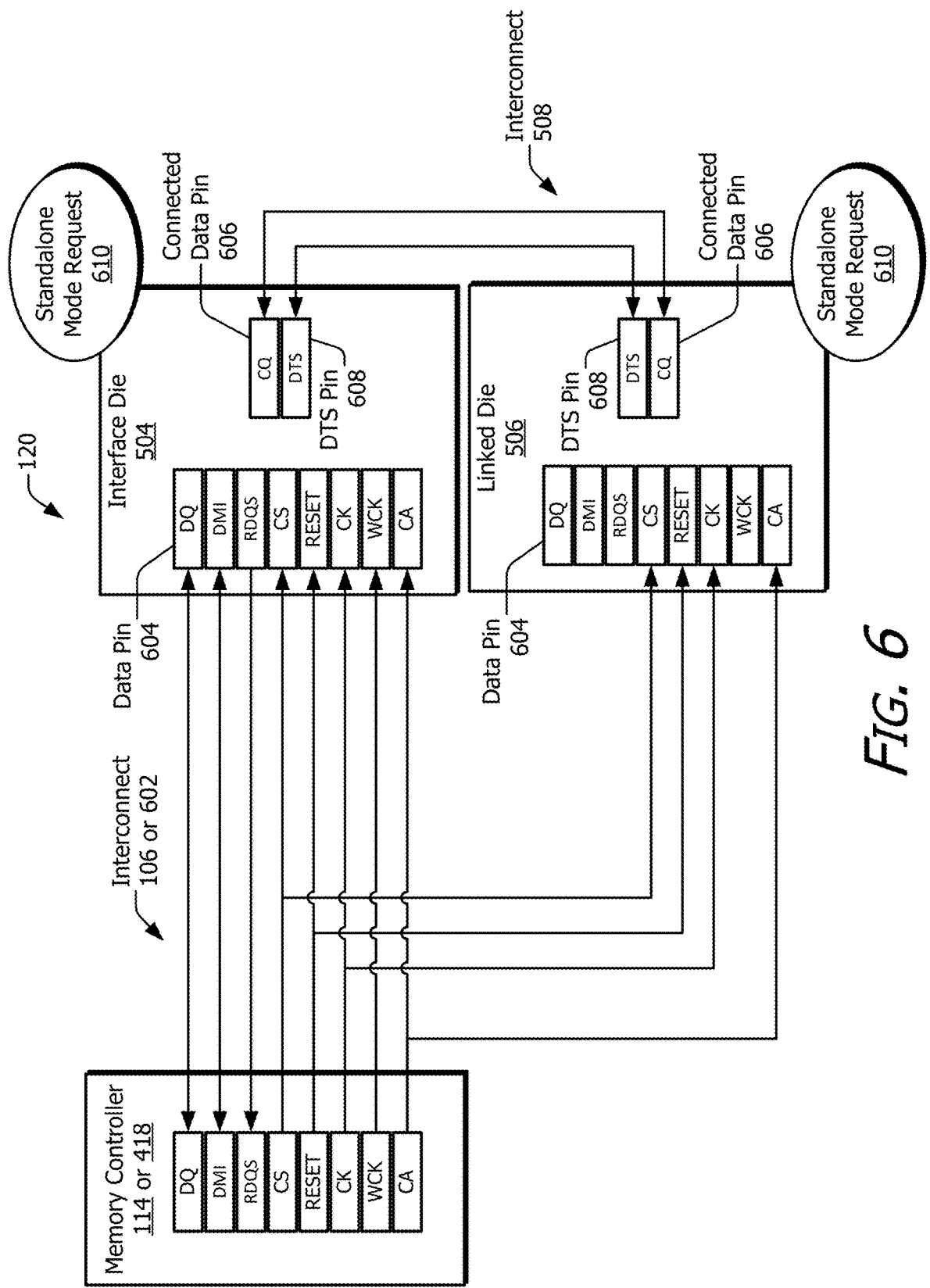
FIG. 6 illustrates example connections between a memory controller and multiple interconnected dies.

FIG. 6 illustrates example connections between the memory controller 114 or 418 and multiple interconnected dies 120 of the memory device 108. In the case of the memory controller 114, the interconnect 106 can provide multiple lines of electrical communication between the memory controller 114 and each die of the interconnected dies 120. Alternatively, in the case of the memory controller 418, an interconnect 602 can provide multiple lines of electrical communication between the memory controller 418 and each die of the interconnected dies 120. The lines of the interconnect 106 or 602 may correspond to clock (CK) lines, write clock (WCK) lines, write mask lines, command/address (CA) lines, or other memory communication lines. With the interconnect 106 or 602, the interface die 504 and the linked die 506 can receive commands from a common command and address bus.

The interface die 504 and the linked die 506 each include a data pin 604, a connected data pin 606 (CQ 606), and a data tracking signal (DTS) pin 608 (DTS 608). The data pin 604 can represent multiple pins that enable the transfer of multiple bits per access. For example, the data pin 604 can represent eight pins. The data pin 604 may comport, at least partially, with LPDDR5, to another standard, or to no public standard. The interface die 504 and the linked die 506 differ in that the data pin 604 of the interface die 504 is active and operatively coupled to the memory controller 114 or 418. In this way, the interface die 504 can "directly" transmit data to or "directly" receive data from the memory controller 114 or 418 without using another die as an intermediary for sending data to the memory controller 114 or 418 or receiving data from the memory controller 114 or 418. In contrast, the data pin 604 of the linked die 506 is inactive and not operatively coupled to the memory controller 114 or 418. Explained another way, the data pin 604 is floating such that current does not flow through the data pin 604. As such, the linked die 506 is unable to directly communicate with the memory controller 114 or 418. In particular, the linked die 506 is unable to directly transmit data to or directly receive data from the memory controller 114 or 418. Instead, the linked die 506 can "indirectly" communicate with the memory controller 114 or 418 via at least one other die—the interface die 504, which is described next.

The interface die 504 and the linked die 506 each include a connected data pin 606 and a data-tracking-signal pin 608 (DTS pin 608). The connected data pin 606 and the data-tracking-signal pin 608 can each represent multiple pins that enable the transfer of multiple bits per access. For example, the connected data pin 606 can represent 32 pins and the data-tracking-signal pin 608 can represent 2 pins. The interconnect 508 operatively couples the linked die 506 to the interface die 504 via the connected data pin 606 of each die and via the data-tracking-signal pin 608 of each die. With the interconnect 508, the connected data pins 606, and the data-tracking-signal pin 608, the linked die 506 can transmit data to or receive data from the interface die 504 during the interconnected mode 308. In particular, the interface die 504 can transfer data from the memory controller 114 or 118 to the linked die 506 during the write operation 312. Also, the interface die 504 can transfer data from the linked die 506 to the memory controller 114 or 118 during the read operation 314. In this way, the linked die 506 can indirectly transmit data to or indirectly receive data from the memory controller 114 or 418 through the interface die 504. Explained another way, the interface die 504 acts as an interface for the linked die 506 and passes data between the linked die 506 and the memory controller 114 or 418 in accordance with the interconnected mode 308.

The interconnected die architecture illustrated in FIG. 6 can reduce cost and conserve space within the apparatus 102. For example, the interconnect 106 or 602 can be implemented with fewer lines of electrical communication as fewer pins on the linked die 506 may be active relative to the interface die 504.

Prior to integration within the interconnected die architecture, the interface die 504 or the linked die 506 are not operatively coupled together via the connected data pin 606 and the data-tracking-signal pin 608. In this case, the interface die 504 or the linked die 506 can be on a wafer or a single die package. As such, the connected data pin 606 and the data-tracking-signal pin 608 can be floating such that current does not flow through these pins.

To perform testing or debugging prior to integration, the interface die 504 or the linked die 506 can receive a standalone-mode request 610 from an external source (e.g., a test engine) or from an internal source (e.g., a mode register of the registers 210). The standalone-mode request 610 instructs the interface die 504 or the linked die 506 to operate according to the standalone mode 310. In particular, the standalone-mode request 610 causes the interface die 504 or the linked die 506 to perform the standalone write operation 316 and/or the standalone read operation 318. Example components of the interface die 504 and/or the linked die 506 are further described with respect to FIG. 7.

Figure 7:
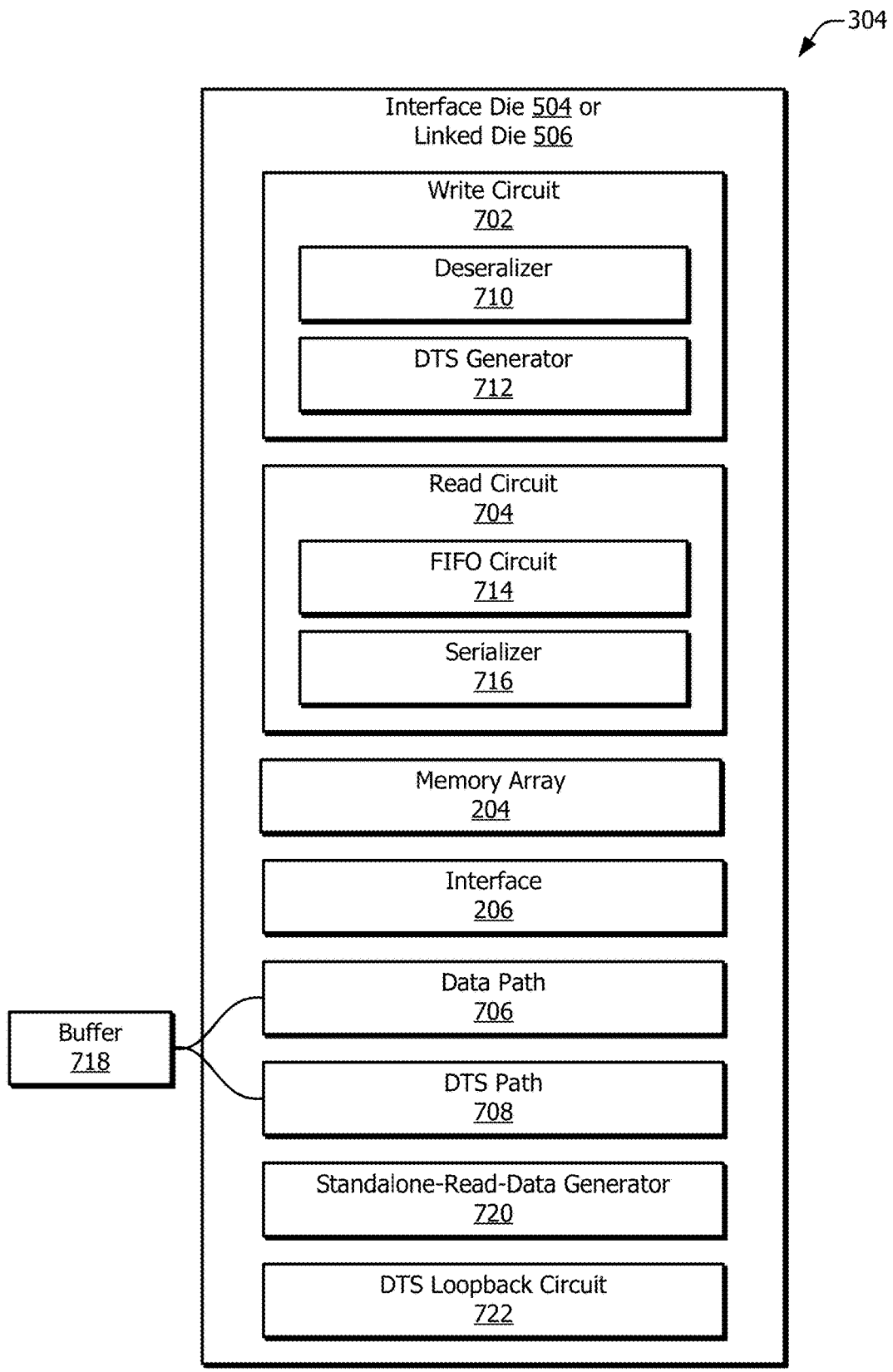
FIG. 7 illustrates example components of a die capable of operating in accordance with a standalone mode.

FIG. 7 illustrates example components of a die 304 capable of operating in accordance with the standalone mode 310. In example implementations, the die 304 can be configured as the interface die 504 or the linked die 506 once integrated as part of the interconnected die architecture. The die 304 includes at least one write circuit 702, at least one read circuit 704, the interface 206, and the memory array 204. The die 304 also includes at least one data path 706 and at least one data-tracking-signal path 708. The write circuit 702 and/or the read circuit 704 can be implemented as part of the control circuitry 208 or the interface 206.

If the die 304 is configured as an interface die 504 during the write operation 312, the write circuit 702 enables data to be written to the memory array 204 of the die 304 and the memory array 204 of another die of the interconnected dies 120. If the die 304 is configured as a linked die 506 during the write operation 312, the write circuit 702 can be disabled. The write circuit 702 also enables data to be written to the memory array 204 of die 304 during the standalone write operation 316. During the standalone read operation 318, the write circuit 702 can be disabled.

The write circuit 702 includes a deserializer 710 and a data-tracking-signal generator 712. The deserializer 710 provides serial-to-parallel data conversion and separates chunks of data during the write operation 312 and during the standalone write operation 316. The data-tracking-signal generator 712 generates data tracking signals during the write operation 312 and generates a data tracking signal during the standalone write operation 316. The data tracking signal contains information about where the data is stored in the memory array 204 and the timing associated with the data.

If the die 304 is configured as an interface die 504 during the read operation 314, the read circuit 704 enables data to be read from the memory array 204 of the die 304 and the memory array 204 of another die of the interconnected dies 120. If the die 304 is configured as a linked die 506 during the read operation 314, the read circuit 704 can be disabled. The read circuit 704 also enables data to be read from the memory array 204 of the die 304 during the standalone read operation 318. During the standalone write operation 316, the read circuit 704 can be disabled.

The read circuit 704 includes at least one first-in first-out circuit 714 and at least one serializer 716. In general, the first-in first-out circuit 714 operates in a pipelined fashion. The serializer 716 provides parallel-to-series data conversion and combines chunks of read data from the interface die 504 and the linked die 506 during the read operation 314. During the standalone read operation 318, the serializer 716 also provides parallel-to-series data conversion and combines a chunk of data from the die 304 under test and another chunk of data generated by the die 304.

The data path 706 propagates data between the data pin 604, the memory array 204, and the connected data pin 606. The data-tracking-signal path 708 propagates a data tracking signal between the data-tracking-signal generator 712, the memory array 204, the read circuit 704, and the data-tracking-signal pin 608. The data path 706 and the data-tracking-signal path 708 can include one or more buffers 718. The buffers 718 can be used to drive the data and the data-tracking-signal according to a current mode (e.g., according to the interconnected mode 308 or the standalone mode 310). In some cases, different combinations of buffers 718 can be enabled according to the write operation 312, the read operation 314, the standalone write operation 316, and/or the standalone read operation 318.

To implement aspects of the standalone mode 310, the die 304 also includes a standalone-read-data generator 720 and a data-tracking-signal loopback circuit 722 (DTS loopback circuit 722). In general, the standalone-read-data generator 720 generates a chunk of read data during the standalone read operation 318 and passes the chunk of read data to the read circuit 704 via the data path 706. This chunk of read data has a predetermined bit pattern serves as an alternative to a chunk of read data otherwise provided by the linked die 506 during the read operation 314.

The data-tracking-signal loopback circuit 722 generates another data tracking signal during the standalone read operation 318. The other data tracking signal serves as an alternative to a data tracking signal otherwise provided by the linked die 506 during the read operation 314. The data-tracking-signal loopback circuit 722 passes the data tracking signal to the read circuit 704 via the data-tracking-signal path 708. With the standalone-read-data generator 720 and the data-tracking-signal loopback circuit 722, the die 304 can perform the standalone read operation 318 without being integrated within the interconnected die architecture (e.g., without being connected to another die 304 of the interconnected dies 120). Operations of the die 304 are further described with respect to FIGS. 8-1 to 11.

Figures 1, 8:
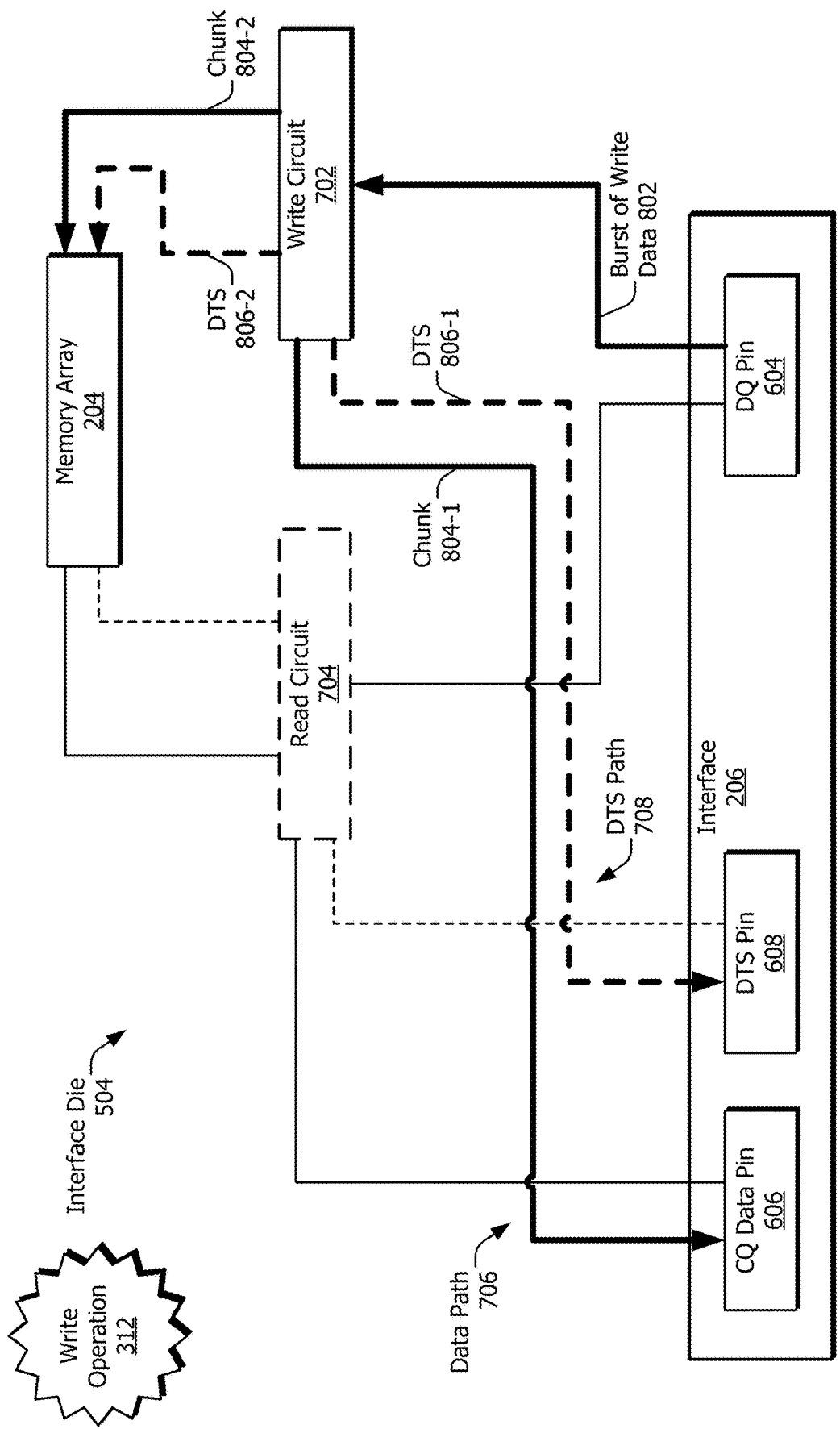
Figures 2, 8:
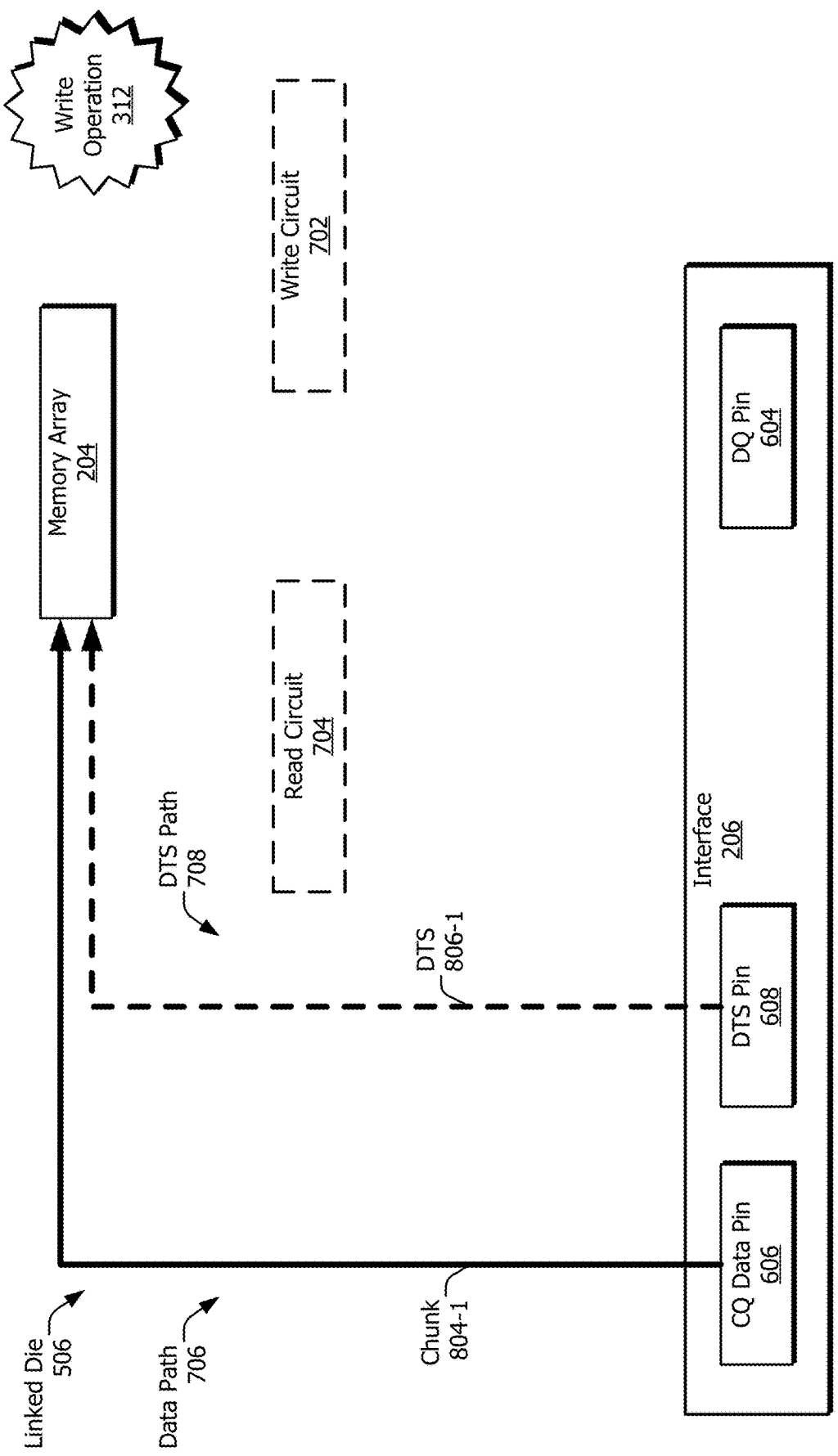

FIG. 8-1 illustrates an example interface die 504 performing aspects of the write operation 312 in accordance with the interconnected mode 308. In the depicted configuration, the write circuit 702 is coupled to the interface 206 and the memory array 204. The read circuit 704 is also coupled to the memory array 204 and the interface 206. The interface die 504 includes data paths, which are indicated using solid lines, and data-tracking-signal paths 708, which are indicated using dashed lines. Although not explicitly shown, the interface die 504 is integrated within the interconnected die architecture such that the connected data pin 606 and the data-tracking-signal pin 608 are coupled to corresponding pins of a linked die 506, which is shown in FIG. 8-2.

Some components of the interface die 504 can be optionally disabled during the write operation 312. These components are indicated using dashed lines. For example, the read circuit 704 can optionally be disabled during the write operation 312.

During the write operation 312, the interface die 504 receives, from the memory controller 114 or 418, one or more bursts of write data 802 at the data pin 604 of the interface 206. Each burst of write data 802 includes multiple chunks 804. For instance, a burst of write data 802 includes a first chunk 804-1 and a second chunk 804-2. Each burst of write data 802 can include, for instance, 32 bytes in accordance with a mode of the memory device 108. In example implementations, the first chunk 804-1 can correspond to a lower 16 bytes, and the second chunk 804-2 can correspond to an upper 16 bytes. In other words, the first chunk 804-1 can include a least-significant byte, and the second chunk 804-2 can include a most-significant byte. In total, the first chunk 804-1 and the second chunk 804-2 represent the 32 bytes of the burst of write data 802. Bursts of write data 802 can, however, be of different lengths, such as 16 bytes. In this case, each chunk 804 can represent 8 bytes of the burst of write data 802.

As each chunk 804 is received, the interface die 504 passes the chunk 804 through the deserializer 710 of the write circuit 702. In general, the deserializer 710 operates in a pipelined fashion on a previously received chunk 804 as a next chunk 804 is received at the data pin 604 of the interface die 504. For example, the deserializer 710 operates on the first chunk 804-1 as the interface die 504 receives the second chunk 804-2 from the memory controller 114 or 418.

After deserialization, the interface die 504 transfers (e.g., propagates or passes) one of the chunks 804 (e.g., chunk 804-1) from the write circuit 702 to the connected data pin 606 using the data path 706. The interface die 504 also transfers another one of the chunks 804 (e.g., chunk 804-2) from the write circuit 702 to the memory array 204 using the data path 706. As an example, the interface die 504 transfers odd-numbered chunks 804 to the linked die 506 (when starting to count from one), and writes even-numbered chunks 804 to its memory array 204 (when starting to count from one). As another example, the interface die 504 writes odd-numbered chunks 804 to its memory array 204 (when starting to count from one), and transfers even-numbered chunks 804 to the linked die 506 (when starting to count from one).

The interface die 504 also generates a first data tracking signal 806-1 (DTS 806-1) associated with the chunk 804-1 and a second data tracking signal 806-2 (DTS 806-2) associated with the chunk 804-2. Using the data-tracking-signal path 708, the interface die 504 transfers the data tracking signal 806-1 from the write circuit 702 to the data-tracking-signal pin 608. The interface die 504 also uses the data-tracking-signal path 708 to transfer the data tracking signal 806-2 to the memory array 204. The linked die 506 accepts the chunk 804-1 and the data tracking signal 806-1, as further described with respect to FIG. 8-2.

FIG. 8-2 illustrates an example linked die 506 performing aspects of the write operation 312 in accordance with the interconnected mode 308. In the depicted configuration, the interface 206 is coupled to the memory array 204. Some components of the linked die 506 can be optionally disabled during the write operation 312. These components are indicated using dashed lines. In this example, the write circuit 702 and the read circuit 704 can optionally be disabled during the write operation 312. Although not explicitly shown, the read circuit 704 and/or the write circuit 702 can be coupled to the memory array 204 and the interface 206 via the data path 706 and the data-tracking-signal path 708 as shown in the interface die 504.

During the write operation 312, the linked die 506 uses the data path 706 and the data-tracking-signal path 708 to respectively transfer the chunk 804-1 and the data tracking signal 806-1 to the memory array 204. In particular, the linked die 506 uses the data path 706 to transfer the chunk 804-1 from the connected data pin 606 to the memory array 204. Additionally, the linked die 506 uses the data-tracking-signal path 708 to transfer the data tracking signal 806-1 from the data-tracking-signal pin 608 to the memory array 204. The linked die 506 writes the chunk 804-1 to the memory array 204. The read operation 314 is further described with respect to FIGS. 9-1 and 9-2.

Figures 1, 9:
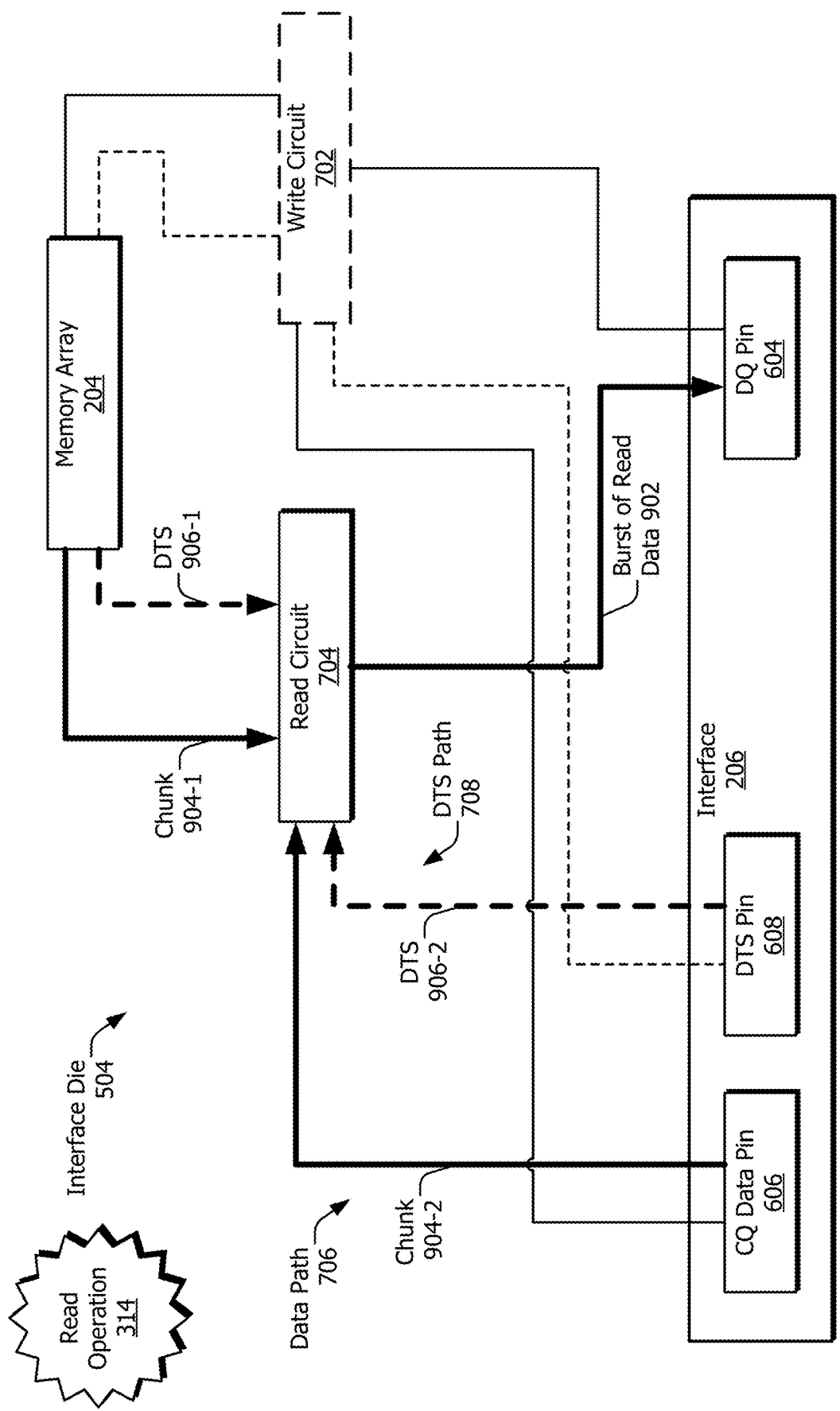
Figures 2, 9:
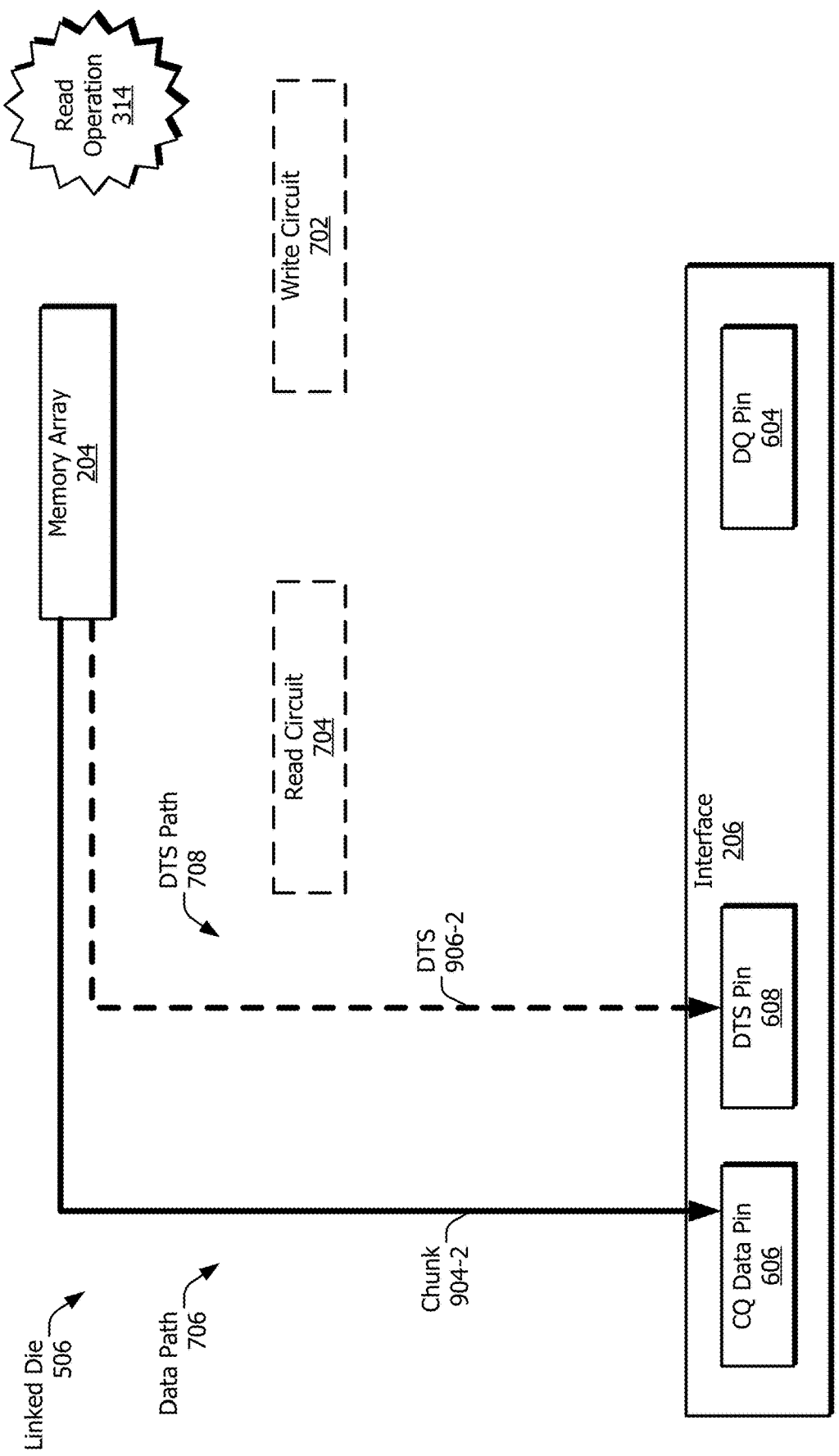

FIG. 9-1 an example interface die 504 performing aspects of the read operation 314 in accordance with the interconnected mode 308. Although not explicitly shown, the interface die 504 is integrated within the interconnected die architecture such that the connected data pin 606 and the data-tracking-signal pin 608 are coupled to corresponding pins of a linked die 506, which is shown in FIG. 9-2.

Some components of the interface die 504 can be optionally disabled during the read operation 314. These components are indicated using dashed lines. For example, the write circuit 702 can optionally be disabled during the read operation 314.

During the read operation 314, the interface die 504 transmits a burst of read data 902 to the memory controller 114 or 418. The burst of read data 902 includes a first chunk 904-1 and a second chunk 904-2. The burst of read data 902 can include, for instance, 32 bytes in accordance with a mode of the memory device 108. In example implementations, the first chunk 904-1 can correspond to an upper 16 bytes, and the second chunk 904-2 can correspond to a lower 16 bytes. In other words, the first chunk 904-1 can include a most-significant byte, and the second chunk 904-2 can include the least-significant byte. In total, the first chunk 904-1 and the second chunk 904-2 represent 32 bytes. Bursts of read data 902 can, however, be of different lengths, such as 16 bytes. In this case, each chunk 904 can represent 8 bytes of the burst of read data 902.

To transmit the burst of read data 902 to the memory controller 114 or 418, the interface die 504 can read one of the chunks 904 (e.g., the chunk 904-1) from its memory array 204 and receive another one of the chunks 904 (e.g., the chunk 904-2) from the linked die 506 via the data-tracking-signal pin 608. Using the data path 706 and the data-tracking-signal path 708, the interface die 504 transfers the chunk 904-1 and its corresponding data tracking signal 906-1 from the memory array 204 to the read circuit 704. The interface die 504 also transfers the chunk 904-2 and its corresponding data tracking signal 906-2 from the interface 206 to the read circuit 704. The first-in first-out circuit 714 and the serializer 716 of the read circuit 704 generate the burst of read data 902 based on the chunks 904-1 and 904-2.

In an example implementation, the interface die 504 reads odd-numbered chunks 904 from its memory array 204 (when starting to count from one), and receives even-numbered chunks 904 from the linked die 506 (when starting to count from one). As another example, the interface die 504 receives odd-numbered chunks 904 from the linked die 506 (when starting to count from one), and reads even-numbered chunks 904 from its memory array 204 (when starting to count from one). The linked die 506 transmits the chunk 904-2 and the data tracking signal 906-2 to the interface die 504, as further described with respect to FIG. 9-2.

FIG. 9-2 illustrates an example linked die 506 performing aspects of the read operation 314 in accordance with the interconnected mode 308. In the depicted configuration, the interface 206 is coupled to the memory array 204. Although not explicitly shown, the read circuit 704 and/or the write circuit 702 can be coupled to the memory array 204 and the interface 206 via the data path 706 and the data-tracking-signal path 708 as shown in the interface die 504.

Some components of the linked die 506 can be optionally disabled during the read operation 314. These components are indicated using dashed lines. In this example, the write circuit 702 and the read circuit 704 can optionally be disabled during the read operation 314.

During the read operation 314, the linked die 506 reads the chunk 904-2 from the memory array 204. The linked die 506 uses the data path 706 to transfer the chunk 904-2 from the memory array 204 to the connected data pin 606. Also, the linked die 506 uses the data-tracking-signal path 708 to transfer the data tracking signal 906-2 from the memory array 204 to the data-tracking-signal pin 608.

Figure 11:
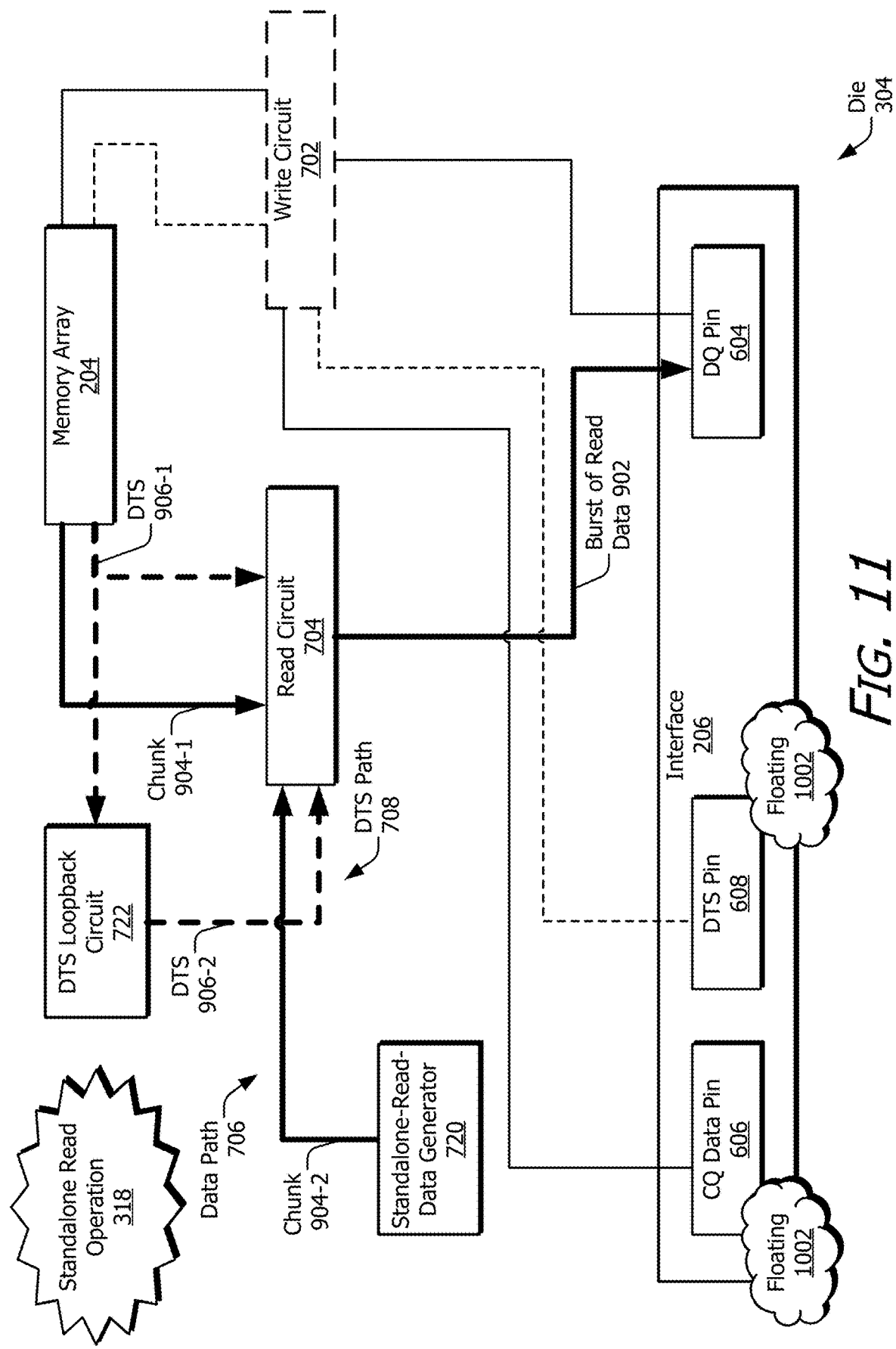
FIG. 11 illustrates an example die performing a standalone read operation in accordance with a standalone mode.

Although not explicitly shown in FIGS. 8-1 to 9-2 for simplicity, the dies 504 and 506 of FIGS. 8-1 to 9-2 can also include the standalone-read-data generator 720 and the data-tracking-signal loopback circuit 722, which are further described with respect to FIG. 11. The standalone-read-data generator 720 and the data-tracking-signal loopback circuit 722 can be disabled during the interconnected mode 308.

Techniques for implementing a standalone mode 310 enable the interface die 504 and/or the linked die 506 to perform an alternative form of the write operation 312 and the read operation 314 for testing and debugging prior to being integrated within the linked die architecture. Aspects of the standalone mode 310 are further described with respect to FIGS. 10 and 11.

Figure 10:
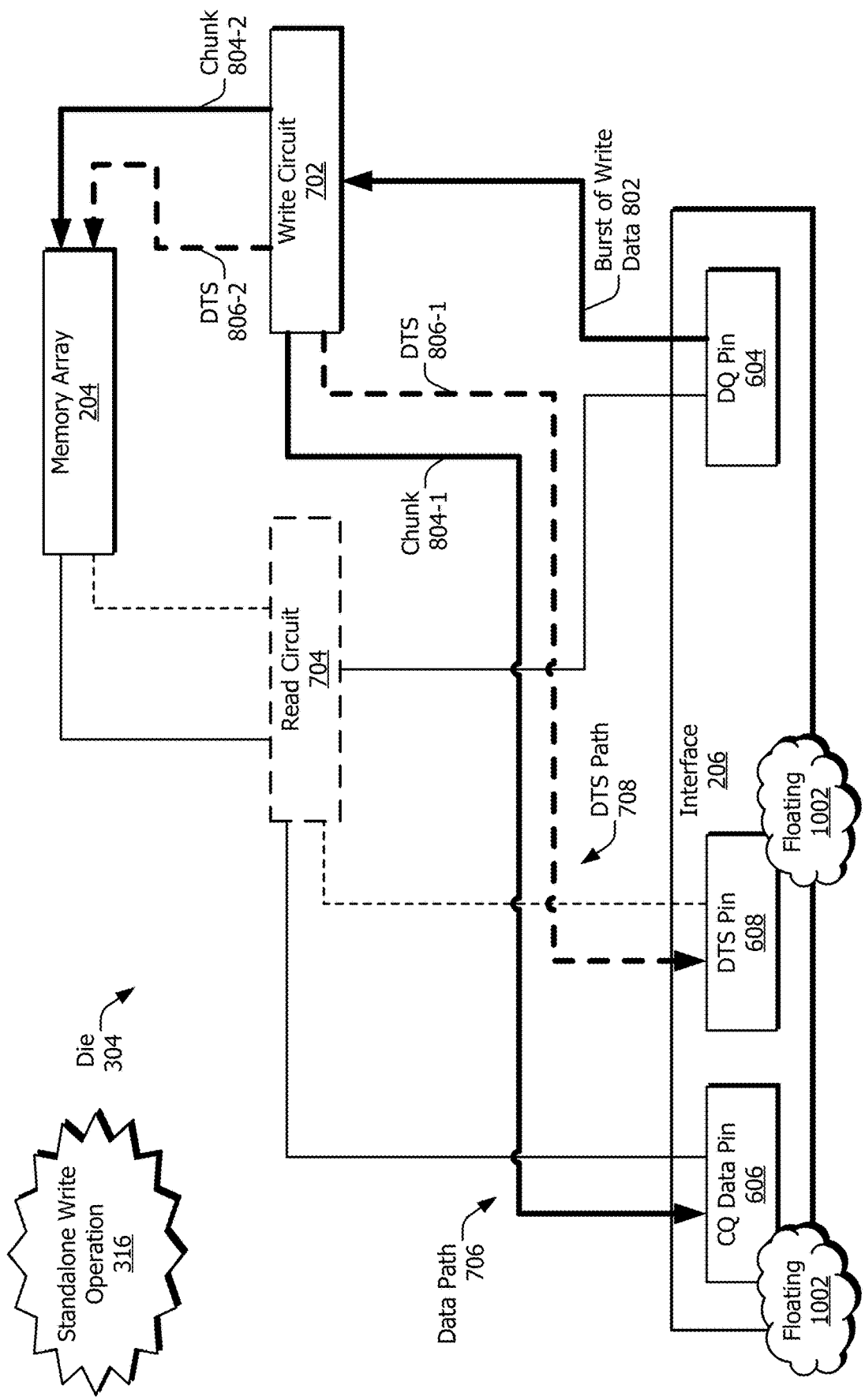
FIG. 10 illustrates an example die performing a standalone write operation in accordance with a standalone mode.

FIG. 10 illustrates an example die 304 performing the standalone write operation 316 in accordance with the standalone mode 310. The die 304 can be configured as the interface die 504 or the linked die 506 within an interconnected die architecture. Prior to integration within the interconnected die architecture, the connected data pin 606 and the data-tracking-signal pin 608 of the die 304 are not connected to corresponding pins of another die. As such, the connected data pin 606 and the data-tracking-signal pin 608 are floating 1002 (e.g., not connected to the corresponding pins of a linked die 506).

The die 304 receives the standalone-mode request 610 to perform the standalone write operation 316. The standalone write operation 316 can be similar to the write operation 312 performed by the interface die 504, as shown in FIG. 8-1. Instead of transferring one of the chunks 804 of the burst of write data 802 to one of the interconnected dies 120 according to the write operation 312, however, the die 304 discards (e.g., disregards or ignores) the chunk 804 during the standalone write operation 316.

During the standalone write operation 316, the die 304 accepts a burst of write data 802 at the data pin 604. The burst of write data 802 includes a first chunk 804-1 and a second chunk 804-2. The die 304 writes one of the chunks 804 (e.g., 804-2) of the burst of write data 802 to its memory array 204. The die 304 also discards another one of the chunks 804 of the burst of write data 802 (e.g., the chunk 804-1). The die 304 discards another one of the chunks 804 (e.g., the chunk 804-1). In one example implementation, the die 304 transfers the chunk 804-1 and the data tracking signal 806-1 from the write circuit 702 to the connected data pin 606 and the data-tracking-signal pin 608, respectively. However, because the connected data pin 606 and the data-tracking-signal pin 608 are floating 1002, the chunk 804-1 and the data tracking signal 806-1 are effectively discarded. The die 304 can also perform a standalone read operation 318, as further described with respect to FIG. 11.

FIG. 11 illustrates an example die 304 performing the standalone read operation 318 in accordance with the standalone mode 310. The die 304 can be configured as the interface die 504 or the linked die 506 within an interconnected die architecture. Prior to integration within the interconnected die architecture, the connected data pin 606 and the data-tracking-signal pin 608 of the die 304 are not connected to corresponding pins of another die. As such, the connected data pin 606 and the data-tracking-signal pin 608 are floating 1002.

The die 304 receives the standalone-mode request 610 to perform the standalone read operation 318. The standalone read operation 318 can be similar to the read operation 314 performed by the interface die 504, as shown in FIG. 9-1. Instead of receiving one of the chunks 904 and one of the data tracking signals 906 from the linked die 506, however, the die 304 generates an alternative chunk 904 and an alternative data tracking signal 906 during the standalone read operation 318.

During the standalone read operation 318, the die 304 reads the chunk 904-1 from the memory array 204 and transfers the first chunk 904-1 and the corresponding data tracking signal 906-1 from the memory array 204 to the read circuit 704. The die 304 also generates the second chunk 904-2 using the standalone-read-data generator 720. The second chunk 904-2 represents predetermined data (e.g., previously known data) having a particular bit pattern. In some cases, the standalone-read-data generator 720 can select the particular bit pattern from at least two available bit patterns. An example implementation of the standalone-read-data generator 720 is further described with respect to FIG. 12.

Using the data-tracking-signal loopback circuit 722, the die 304 generates a second data tracking signal 906-2 based on the first data tracking signal 906-1. In some implementations, the data-tracking-signal loopback circuit 722 routes the data tracking signal 906-1 to the read circuit 704 such that the read circuit 704 associates the routed data tracking signal 906-1 (e.g., the data tracking signal 906-2) with the chunk 904-2. An example implementation of the data-tracking-signal loopback circuit 722 is further described with respect to FIG. 13.

Figure 12:
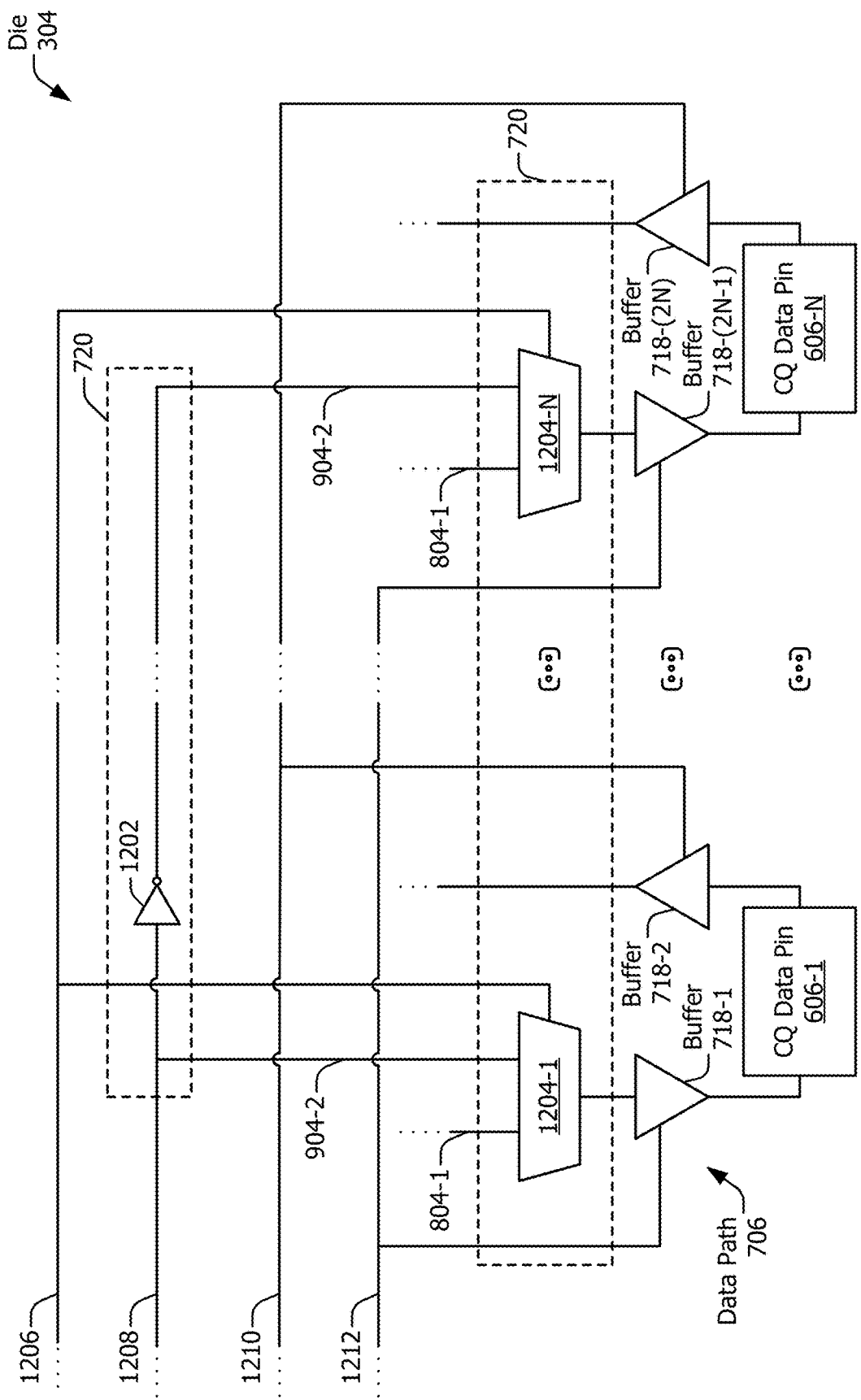
FIG. 12 illustrates an example standalone-read-data generator to support a standalone read mode.

FIG. 12 illustrates an example standalone-read-data generator 720 that supports the standalone read mode 318. In FIG. 12, a portion of the die 304 is shown to include the standalone-read-data generator 720, the data path 706, and connected data pin 606-1 to 606-N, where N represents a positive integer. Each connected data pin 606-1 to 606-N in FIG. 12 is associated with an individual bit of a chunk 804 or 904. For example, the connected data pin 606-1 is associated with a first bit (when starting to count from one) of the chunk 804 or 904, and the connected data pin 606-N is associated with a last bit of the chunk 804 or 904.

The data path 706 includes buffers 718-1, 718-2 . . . 718-(2N-1), and 718-(2N). In general, each connected data pin 606 is connected to an output of a buffer 718 associated with transmission (e.g., buffers 718-1 and 718-(2N-1)) and an input of a buffer 718 associated with reception (e.g., buffers 718-2 and 718-(2N)). Inputs of the buffers 718 associated with transmission are coupled to the standalone-read-data generator 720. Although not explicitly shown, outputs of the buffers 718 associated with reception are coupled to the read circuit 704.

The standalone-read-data generator 720 includes one or more inverters 1202 and multiple multiplexers 1204-1 to 1204-N. The inverter 1202 enables the standalone-read-data generator 720 to generate a particular bit pattern. Although not explicitly shown, one of the inputs of each of the multiplexers 1204-1 to 1204-N is coupled to the write circuit 702. Assuming the die 304 represents an interface die 504, the multiplexers 1204-1 to 1204-N enable the chunk 804-1 of the burst of write data 802 to be transferred to the linked die 506 during the write operation 312. The multiplexers 1204-1 to 1204-N also enable the chunk 904-2 generated by the standalone-read-data generator 720 to be transferred to the read circuit 704 during the standalone read operation 318.

To perform the standalone read operation 318, the standalone-read-data generator 720 receives a standalone-mode enable signal 1206 based on the standalone-mode request 610. The standalone-mode enable signal 1206 causes the multiplexers 1204-1 to 1204-N to pass the chunk 904-2 to the read circuit 704. In particular, individual bits of the chunk 904-2 respectively propagate through the buffers 718-1 and 718-(2N-1), the connected data pins 606-1 to 606-N, and the buffers 718-2 and 718-(2N) to the read circuit 704.

During the standalone read operation 318, the buffers 718-2 and 718-(2N) are enabled by a receive enable signal 1210. Also, the buffers 718-1 and 718-(2N-1) are enabled by a transmit enable signal 1212. By enabling both the buffers 718 associated with transmission (e.g., the buffers 718-1 and 718-(2N-1)) and the buffers 718 associated with reception (e.g., the buffers 718-2 and 718-(2N)), the chunk 904-2 can propagate from the standalone-read-data generator 720 to the read circuit 704 through the connected data pins 606-1 to 606-N. Although not explicitly shown, the receive enable signal 1210 and the transmit enable signal 1212 can be set based on the standalone-mode enable signal 1206.

In the depicted configuration, the standalone-read-data generator 720 generates the chunk 904-2 based on a test data signal 1208. In this example, the standalone-read-data generator 720 can generated two different bit patterns based on the test data signal 1208 being representing a high voltage (e.g., a "1") or a low voltage (e.g., a "0").

In other implementation, the die 304 can perform the standalone read operation 318 without the test data signal 1208. In this case, the standalone-read-data generator 720 can generate the chunk 804-2 based on the standalone-mode enable signal 1206 to provide a known bit pattern. Alternatively, the standalone-read-data generator 720 can generate the chunk 904-2 based on data that remains on the data bus. In this case, the bit pattern may not be known. Still other implementations of the standalone-read-data generator 720 can generate a user-defined bit pattern.

Figure 13:
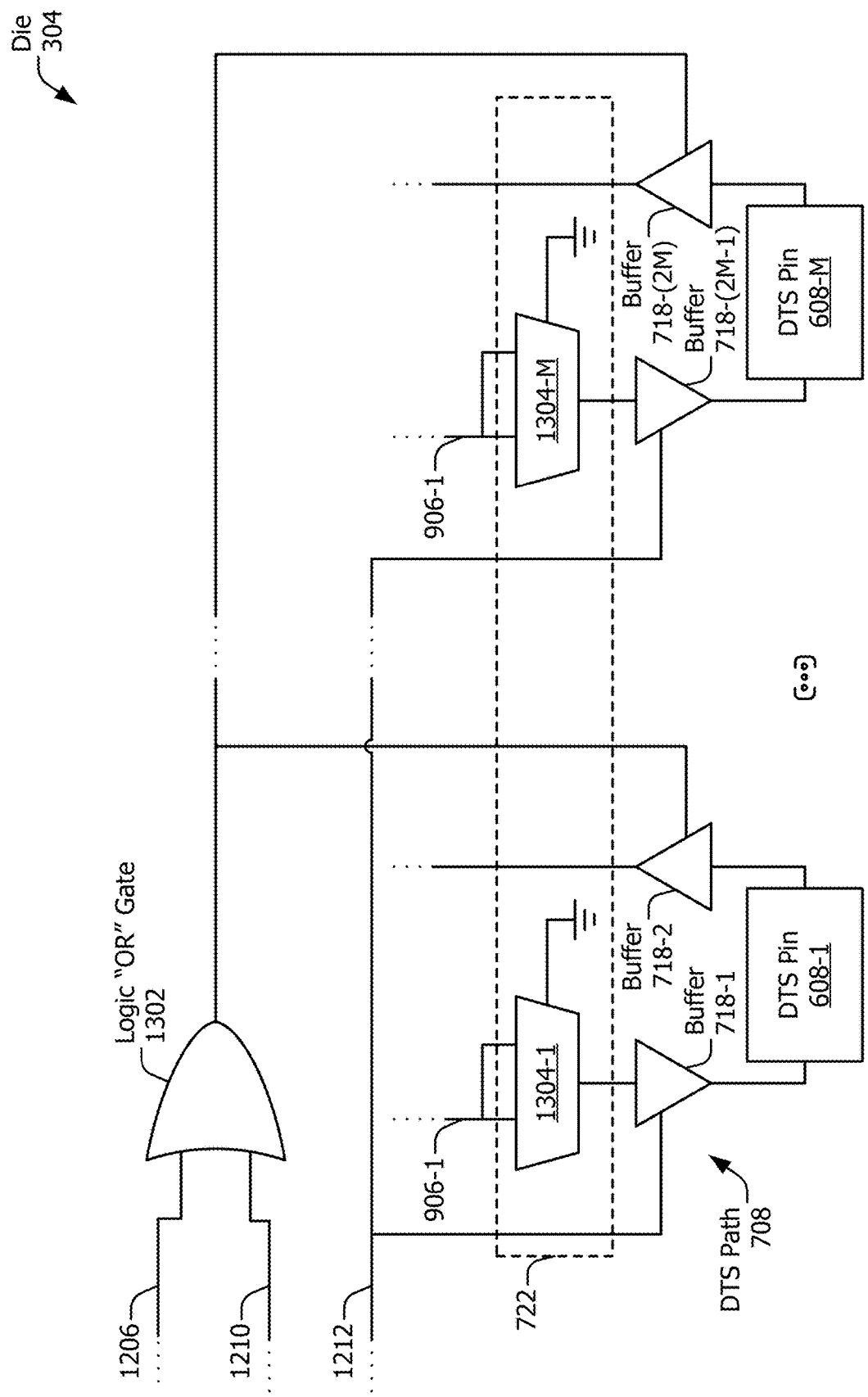
FIG. 13 illustrates another example data-tracking-signal loopback circuit to support a standalone read mode.

FIG. 13 illustrates an example data-tracking-signal loopback circuit 722 that supports the standalone read mode 318. In FIG. 13, a portion of the die 304 is shown to include the data-tracking-signal loopback circuit 722, the data-tracking-signal path 708, a logic "OR" gate 1302, and data-tracking-signal pins 608-1 to 608-M, where M represents a positive integer. The data-tracking-signal path 708 includes buffers 718-1, 718-2 . . . 718-(2M-1), and 718-(2M). In general, each data-tracking-signal pin 608 is connected to an output of a buffer 718 associated with transmission (e.g., buffers 718-1 and 718-(2M-1)) and an input of a buffer 718 associated with reception (e.g., buffers 718-2 and 718-(2M)). Inputs of the buffers 718 associated with transmission are coupled to the data-tracking-signal loopback circuit 722. Although not explicitly shown, outputs of the buffers 718 associated with reception are coupled to the read circuit 704.

In the depicted configuration, the data-tracking-signal loopback circuit 722 includes multiplexers 1304-1 to 1304-M, which can be similar to the multiplexers 1204-1 to 1204-N of FIG. 12. The multiplexers 1304-1 to 1304-M are designed to pass the data tracking signal 906-1 to the read circuit 704 during the standalone read operation 318. In this case, the multiplexers 1304-1 to 1304-M pass the data tracking signal 906-1 regardless of the operation being performed. In other implementations, the data-tracking-signal loopback circuit 722 is without the multiplexers 1304-1 to 1304-M.

During the standalone read operation 318, the buffers 718-2 and 718-(2M) are enabled by the receive enable signal 1210 or the standalone-mode enable signal 1206. In other words, the state of the buffers 718-2 and 718-(2M) is controlled by an output of the logic "OR" gate 1302. Also, the buffers 718-1 and 718-(2M-1) are enabled by the transmit enable signal 1212. By enabling both the buffers 718 associated with transmission (e.g., the buffers 718-1 and 718-(2M-1)) and the buffers 718 associated with reception (e.g., the buffers 718-2 and 718-(2M)), the data tracking signal 906-1 can propagate from the data-tracking-signal loopback circuit 722 to the read circuit 704 through the data-tracking-signal pins 608-1 to 608-M. Although not explicitly shown, the transmit enable signal 1212 can be set based on the standalone-mode enable signal 1206.

Other implementations of the standalone-read-data generator 720 and the data-tracking-signal loopback circuit 722 are also possible. For example, other implementations of the standalone-read-data generator 720 can inject the chunk 904-2 within the data path 706 without passing the chunk 804-1 through the connected data pin 606. As another example, other implementations of the data-tracking-signal loopback circuit 722 can generate the data tracking signal 906-2 without passing the data tracking signal 906-1 through the data-tracking-signal pin 608.

Although aspects of the standalone mode 310 are described with respect to the connected data pin 606 and the data-tracking-signal pin 608 being floating 1002, the die 304 can also operate according to the standalone mode 310 in other situations. For example, consider a case in which the die 304 is integrated within the interconnected die architecture. In this case, the connected data pin 606 and the data-tracking-signal pin 608 can be connected to a high impedance (e.g., via a switch) based on the standalone-mode request 610 to simulate the die 304 being independent (e.g., separate from another interconnected die 120). With the pins 606 and 608 set to high impedance, the die 304 can operate according to the standalone mode 310 and perform the standalone write operation 316 and/or the standalone read operation 318.

Example Methods

Figure 15:
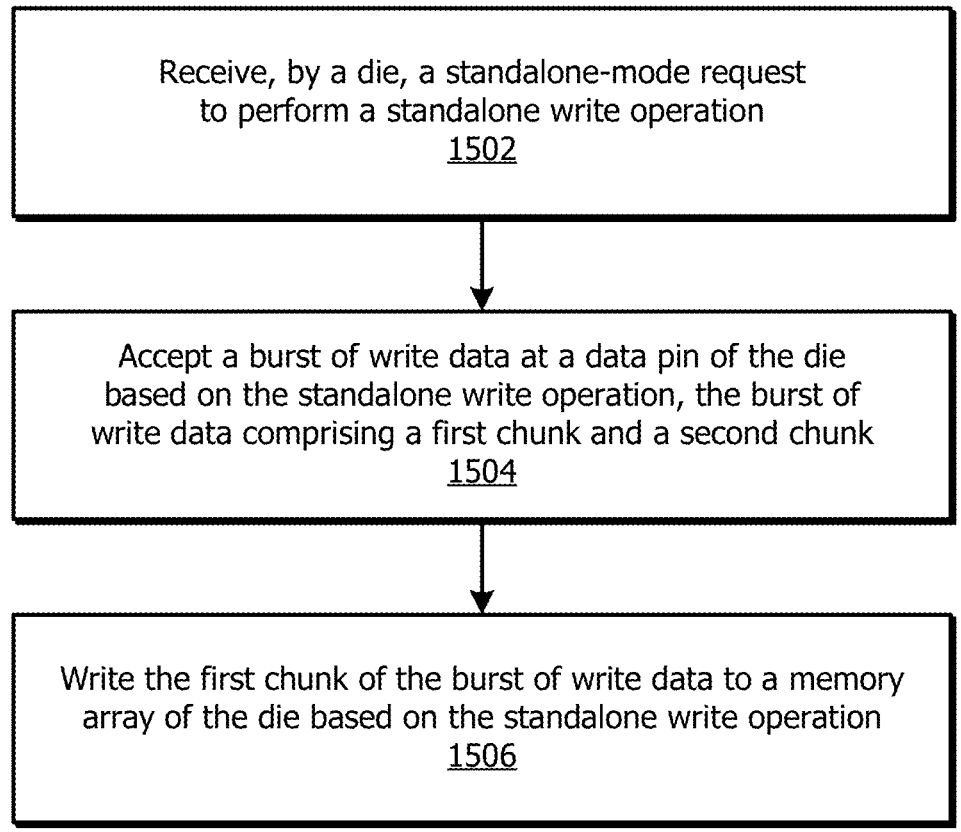
FIG. 15 illustrates an example method for performing a standalone write operation in accordance with a standalone mode.
Figure 16:
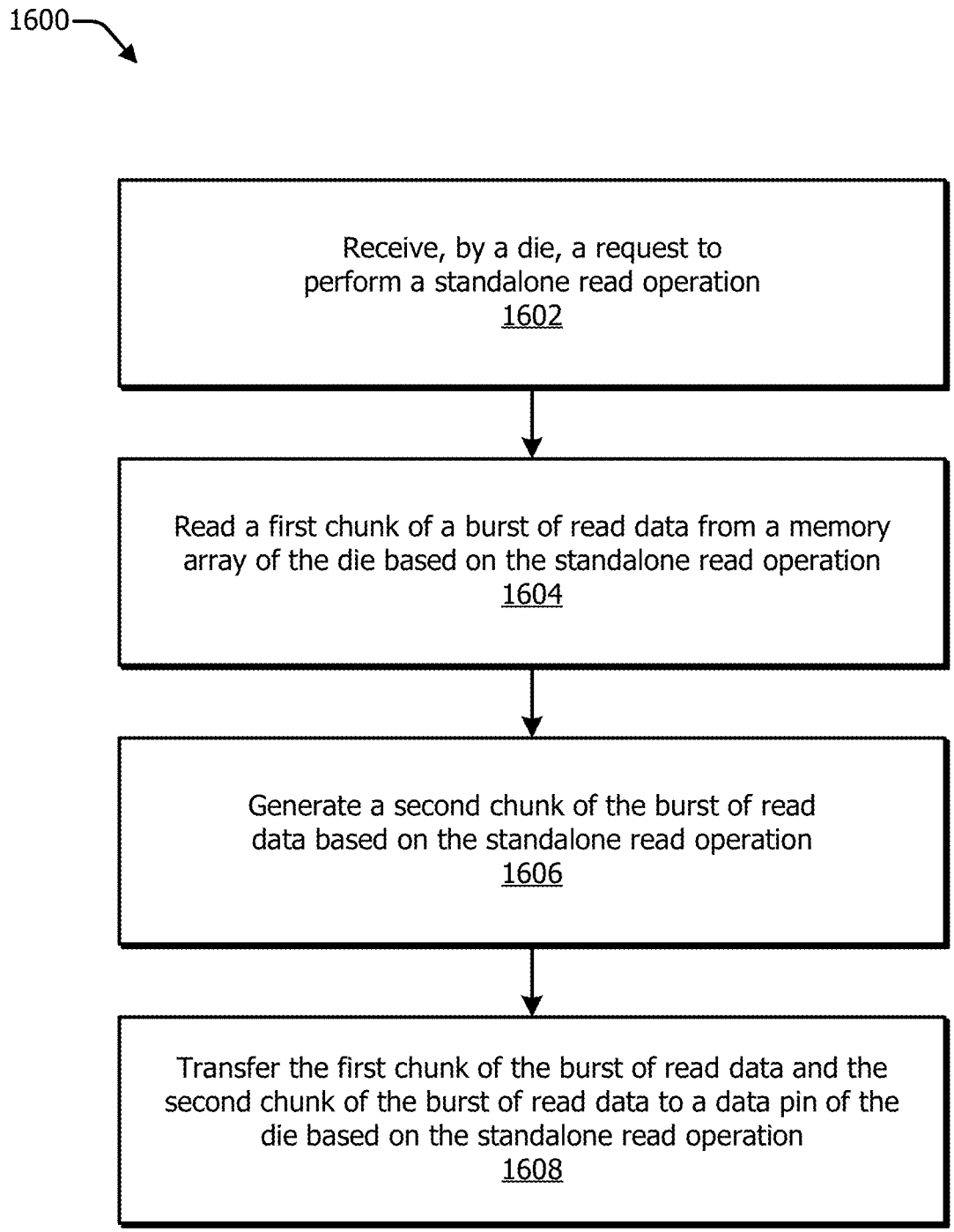
FIG. 16 illustrates an example method for performing a standalone read operation in accordance with a standalone mode.

This section describes example methods for implementing a standalone mode with reference to the flow charts and flow diagrams of FIGS. 14, 15, and 16. These descriptions may also refer to components, entities, and other aspects depicted in FIGS. 1-13 by way of example only. The described methods are not necessarily limited to performance by one entity or multiple entities operating on one device.

FIG. 14 illustrates a flow diagram 1400, which includes operations 1402 through 1406. These operations can be performed by a die 304 to implement aspects of a standalone mode 310. At 1402, a die 304 performs a standalone write operation 316 or a standalone read operation 318 prior to a connected data pin 606 of the die 304 being coupled to another connected data pin of another die. In other words, the die 304 operates according to the standalone mode 310 prior to being integrated within the interconnected die architecture. In this case, the connected data pin 606 can be considered floating 1002. The standalone write operation 316 and the standalone read operation 318 enable testing to occur independent of whether the die 304 is connected to another one of the interconnected dies 120. In this case, the die 304 can be implemented on a wafer or a single die package.

At 1404, the connected data pin 606 of the die 304 is coupled to another connected data pin of another die. For example, the die 304 is integrated within the interconnected die architecture and packaged with one or more other interconnected dies 120.

At 1406, the die 304 performs a write operation 312 or a read operation 314 jointly with the other die based on the connected data pin being coupled to the other connected data pin of the other die. In other words, the die 304 operates according to the interconnected mode 308. The die 304 can be configured as the interface die 504 or the linked die 506.

FIG. 15 illustrates a flow diagram 1500, which includes operations 1502 through 1506. These operations can be performed by a die 304 to implement aspects of a standalone mode 310 in general and implement aspects of a standalone write operation 316 in particular. At 1502, the die 304 receives a request (e.g., a standalone-mode request 610) to perform a standalone write operation 316. For example, the die 304 receives the standalone-mode request 610 from a mode register or an external test engine.

At 1504, the die 304 accepts a burst of write data 802 at a data pin 604 of the die 304 based on the standalone write operation 316. The burst of write data 802 comprises a first chunk 804-1 and a second chunk 804-2. In some implementations, the first chunk 804-1 includes a most-significant byte, and the second chunk 804-2 includes a least-significant byte. In other implementations, the first chunk 804-1 includes the least-significant byte, and the second chunk 804-2 includes the most-significant byte.

At 1506, the die 304 writes the first chunk 804-1 of the burst of write data 802 to a memory array 204 of the die 304 based on the standalone write operation 316. The die 304 can also discard (e.g., disregard or ignore) the second chunk 804-2 of the burst of write data 802 according to the standalone write operation 316. In some implementations, the die 304 transfers the second chunk 804-2 of the burst of write data 802 to the connected data pin 606. As the connected data pin 606 is floating 1002, the second chunk 804-2 of the burst of write data 802 is discarded.

FIG. 16 illustrates a flow diagram 1600, which includes operations 1602 through 1608. These operations can be performed by a die 304 to implement aspects of a standalone mode 310 in general and implement aspects of a standalone read operation 318 in particular. At 1602, the die 304 receives a standalone-mode request 610 to perform a standalone read operation 318. For example, the die 304 receives the standalone-mode request 610 from a mode register or an external text engine.

At 1604, the die 304 reads a first chunk 904-1 of a burst of read data 902 from a memory array 204 of the die 304 based on the standalone read operation 318. At 1606, the die 304 generates a second chunk 904-2 of the burst of read data 902 based on the standalone read operation 318. The second chunk 904-2 of the burst of read data 902 can include data with a predetermined bit pattern that is selected according to the standalone-mode request 610.

At 1608, the die 304 transfers the first chunk 904-1 of the burst of read data 902 and the second chunk 904-2 of the burst of read data 902 to the data pin 604 of the die based on the standalone read operation 318.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-6, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 102 and components of 200, include, for instance, a memory controller 114, an interconnect 106, and a memory device 108. FIGS. 1-6 illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of implementing a standalone mode have been described in language specific to certain features and/or methods, the subject of the appended claims is not necessarily limited to the specific features or methods described. Rather, the specific features and methods are disclosed as a variety of example implementations of implementing a standalone mode.

What is claimed is:

1. An apparatus comprising:
a die configured to be one die of multiple dies, the die comprising:
a data pin;
a connected data pin configured to be:
floating such that the connected data pin is electrically decoupled from another die of the multiple dies; or
coupled to another connected data pin of the other die; and
a memory array,
the die configured to operate in accordance with a standalone mode based on the connected data pin being floating, the standalone mode comprising the die configured to pass data between the data pin and the memory array.

2. The apparatus of claim 1, wherein the die is configured to:
perform a standalone write operation in accordance with the standalone mode;
accept a burst of write data at the data pin based on the standalone write operation, the burst of write data comprising a first chunk and a second chunk; and
write the first chunk of the burst of write data to the memory array based on the standalone write operation.

3. The apparatus of claim 2, wherein the die is configured to discard the second chunk of the burst of write data based on the standalone write operation.

4. The apparatus of claim 3, wherein the die is configured to transfer the second chunk of the burst of write data from the data pin to the connected data pin based on the standalone write operation.

5. The apparatus of claim 1, wherein the die is configured to:
perform a standalone read operation in accordance with the standalone mode;
read a first chunk of a burst of read data from the memory array based on the standalone read operation;
generate a second chunk of the burst of read data based on the standalone read operation; and
transfer the first chunk of the burst of read data and the second chunk of the burst of read data to the data pin based on the standalone read operation.

6. The apparatus of claim 5, wherein:
the die comprises:
a read circuit; and
a data path connected between the connected data pin and the read circuit;
and
the die is configured to propagate the second chunk of the burst of read data through at least a portion of the data path.

7. The apparatus of claim 6, wherein:
the die is configured to:
propagate a first data tracking signal from the memory array to the read circuit, the first data tracking signal associated with the first chunk of the burst of read data; and
generate a second data tracking signal based on the first data tracking signal; and
the read circuit is configured to:
process the first chunk of the burst of read data based on the first data tracking signal; and
process the second chunk of the burst of read data based on the second data tracking signal.

8. The apparatus of claim 7, wherein:
the die comprises a data-tracking-signal pin; and
the die is configured to generate the second data tracking signal by propagating the first data tracking signal from the memory array to the data-tracking-signal pin and propagating the first data tracking signal from the data-tracking-signal pin to the read circuit.

9. The apparatus of claim 5, wherein:
the second chunk comprises a predetermined bit pattern; and
the die is configured to select the predetermined bit pattern from at least two available bit patterns.

10. The apparatus of claim 1, wherein:
the multiple dies are configured to be interconnected by the connected data pin; and
the die is configured to operate in accordance with the standalone mode while the connected data pin is floating or is coupled to the other connected data pin of the other die.

11. The apparatus of claim 10, wherein:
the connected data pin is coupled to the other connected data pin of the other die of the multiple dies;
the data pin is configured to be coupled to a memory controller; and
the die is configured to communicate data with the memory controller during a read operation or a write operation without the data propagating through the other die.

12. The apparatus of claim 10, wherein:
the connected data pin is coupled to the other connected data pin of the other die of the multiple dies;
the data pin is configured to be inactive during a read operation or a write operation; and
the die is configured to communicate data with a memory controller via the other die of the multiple dies during the read operation or the write operation.

13. The apparatus of claim 10, further comprising:
a memory controller coupled to the die.

14. The apparatus of claim 13, wherein:
the apparatus comprises a Compute Express Link® (CXL®) device; and
the memory controller is coupled to the die via an interconnect that is internal to the CXL device.

15. An apparatus comprising:
a die comprising:
a connected data pin configured to be:
floating; or
coupled to another connected data pin of another die of multiple dies,
the die configured to selectively:
perform, based on the connected data pin being floating, a standalone read operation or a standalone write operation; and
perform, based on the connected data pin being coupled to the other connected data pin of the other die, a read operation or a write operation jointly with the other die of the multiple dies.

16. The apparatus of claim 15, wherein the die is configured to:
perform the standalone write operation;
accept a burst of write data at the data pin based on the standalone write operation, the burst of write data comprising a first chunk and a second chunk; and
write the first chunk of the burst of write data to a memory array of the die based on the standalone write operation.

17. The apparatus of claim 15, wherein the die is configured to:
perform the standalone read operation;
read a first chunk of a burst of read data from a memory array of the die based on the standalone read operation;
generate a second chunk of the burst of read data based on the standalone read operation; and
transfer the first chunk of the burst of read data and the second chunk of the burst of read data to the data pin based on the standalone read operation.

18. The apparatus of claim 15, wherein the die is configured to:
perform the read operation or the write operation; and
communicate data with a memory controller during the read operation or the write operation without the data propagating through the other die.

19. The apparatus of claim 15, wherein the die is configured to:
perform the read operation or the write operation; and
the die is configured to communicate data with a memory controller via the other die.

20. A method comprising:
receiving, by a die, a request to perform a standalone write operation;
accepting a burst of write data at a data pin of the die based on the standalone write operation, the burst of write data comprising a first chunk and a second chunk; and
writing the first chunk of the burst of write data to a memory array of the die based on the standalone write operation.

21. The method of claim 20, further comprising discarding the second chunk of the burst of write data based on the standalone write operation.

22. The method of claim 21, further comprising:
transferring the second chunk of the burst of write data from the data pin to a connected data pin of the die based on the standalone write operation,
wherein the connected data pin is floating.

23. The method of claim 20, wherein the receiving of the request, the accepting of the burst of write data, and the writing of the first chunk of the burst of write data is independent of a connected data pin of the die being floating or coupled to another connected data pin of another die.

24. The method of claim 20, further comprising:
receiving, by the die, another request to perform a standalone read operation;
reading a first chunk of a burst of read data from the memory array based on the standalone read operation;
generating a second chunk of the burst of read data based on the standalone read operation; and
transferring the first chunk of the burst of read data and the second chunk of the burst of read data to the data pin based on the standalone read operation.

25. A method comprising:
receiving, by a die, a request to perform a standalone read operation;
reading a first chunk of a burst of read data from a memory array of the die based on the standalone read operation;
generating a second chunk of the burst of read data based on the standalone read operation; and
transferring the first chunk of the burst of read data and the second chunk of the burst of read data to a data pin of the die based on the standalone read operation.

26. The method of claim 25, wherein the receiving of the request, the reading of the first chunk of the burst of read data, the generating of the second chunk of the burst of read data, and the transferring of the first chunk of the burst of read data and the second chunk of the burst of read data is independent of a connected data pin of the die being floating or coupled to another connected data pin of another die.

27. The method of claim 25, further comprising:
receiving, by the die, another request to perform a standalone write operation;
accepting a burst of write data at the data pin based on the standalone write operation, the burst of write data comprising a first chunk and a second chunk; and
writing the first chunk of the burst of write data to the memory array based on the standalone write operation.

28. The method of claim 27, further comprising discarding the second chunk of the burst of write data based on the standalone write operation.

29. The method of claim 28, further comprising:
transferring the second chunk of the burst of write data from the data pin to a connected data pin of the die based on the standalone write operation,
wherein the connected data pin is floating.

30. A method comprising:
performing a standalone write operation or a standalone read operation prior to a connected data pin of a die being coupled to another connected data pin of another die;
coupling the connected data pin of the die to the other connected data pin of the other die; and performing a write operation or a read operation jointly with the other die based on the connected data pin being coupled to the other connected data pin of the other die.

31. The method of claim 30, wherein the performing the standalone write operation or the standalone read operation comprises:

receiving, by the die, a request to perform the standalone write operation;

accepting a burst of write data at a data pin of the die based on the standalone write operation, the burst of write data comprising a first chunk and a second chunk; and writing the first chunk of the burst of write data to a memory array of the die based on the standalone write operation.

32. The method of claim 31, further comprising discarding the second chunk of the burst of write data based on the standalone write operation.

33. The method of claim 30, wherein the performing the standalone write operation or the standalone read operation comprises:

receiving, by the die, a request to perform the standalone read operation;

reading a first chunk of a burst of read data from a memory array of the die based on the standalone read operation;

generating a second chunk of the burst of read data based on the standalone read operation; and transferring the first chunk of the burst of read data and the second chunk of the burst of read data to a data pin of the die based on the standalone read operation.

34. The method of claim 30, wherein the performing the write operation or the read operation comprises communicating data with a memory controller without the data propagating through the other die.

35. The method of claim 30, wherein the performing the write operation or the read operation comprises communicating data with a memory controller via the other die.

* * * * *